(12) United States Patent
Shintani et al.

(10) Patent No.: US 9,082,955 B2
(45) Date of Patent: Jul. 14, 2015

(54) PHASE CHANGE MEMORY DEVICE

(75) Inventors: Toshimichi Shintani, Ibraraki (JP); Takahiro Morikawa, Ibaraki (JP); Takahiro Odaka, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/589,457

(22) Filed: Aug. 20, 2012

(65) Prior Publication Data
US 2013/0048938 A1   Feb. 28, 2013

(30) Foreign Application Priority Data

Aug. 25, 2011  (JP) .................................. 2011-183794

(51) Int. Cl.
*H01L 47/00* (2006.01)
*H01L 45/00* (2006.01)
*H01L 27/24* (2006.01)

(52) U.S. Cl.
CPC ............ *H01L 45/06* (2013.01); *H01L 27/2454* (2013.01); *H01L 27/2481* (2013.01); *H01L 45/124* (2013.01); *H01L 45/144* (2013.01); *H01L 45/1691* (2013.01)

(58) Field of Classification Search
CPC ... H01L 45/06; H01L 45/1233; H01L 45/128; H01L 27/0688
See application file for complete search history.

(56) References Cited

U.S. PATENT DOCUMENTS

| | | | |
|---|---|---|---|
| 8,247,788 B2* | 8/2012 | Seol et al. ......................... 257/2 |
| 2008/0073635 A1* | 3/2008 | Kiyotoshi et al. ................ 257/2 |
| 2008/0149913 A1* | 6/2008 | Tanaka et al. ..................... 257/5 |
| 2011/0235408 A1* | 9/2011 | Minemura et al. ............ 365/163 |

FOREIGN PATENT DOCUMENTS

| | | |
|---|---|---|
| JP | 2008160004 | 7/2008 |
| JP | 2010165982 | 7/2010 |

OTHER PUBLICATIONS

Burr, Geoffrey W., et al Journal of Vacuum Science and Technology B, "Phase Change Memory Technology", vol. 28, Issue 2, pp. 223-262 dated Mar. 30, 2010, San Jose, CA.

* cited by examiner

*Primary Examiner* — Benjamin Sandvik
(74) *Attorney, Agent, or Firm* — McCormick, Paulding & Huber LLP

(57) ABSTRACT

An object of the present invention is to provide a technique for suppressing thermal disturbance of a phase change memory device having a three-dimensional structure. In the phase change memory device having a three-dimensional structure, a material having a high thermal conductivity is used as a gate insulation film of a MOS transistor for selection, and causes heat transmitted to a Si channel layer from a phase change recording film to successfully diffuse to a gate electrode. In this way, since heat generated from a recording bit diffuses to a non-selected bit adjacent to it, it is possible to suppress thermal disturbance. BN, $Al_2O_3$, AlN, $TiO_2$, $Si_3N_4$, ZnO and the like are useful as a gate insulation film having a high thermal conductivity.

3 Claims, 20 Drawing Sheets

PHASE CHANGE MEMORY DEVICE

CROSS-REFERENCE TO RELATED APPLICATION

The present application claims priority from Japanese Patent Application No. 2011-183794 filed on Aug. 25, 2011, the content of which is hereby incorporated by reference into this application.

TECHNICAL FIELD OF THE INVENTION

The present invention relates to a phase change memory device in which digital data is recorded by changing a state of a recording film between an amorphous phase and a crystal phase, and particularly to a technique useful in application to a phase change memory device having a three-dimensional structure.

BACKGROUND OF THE INVENTION

According to spread of digital equipments and development of digital contents such as Internet, importance of a storage device which stores digital data therein increasingly becomes high.

Various performances are required for the storage device, but important performances among them are that a capacity of recording data is large, that a data transmission rate showing a time required to read/write a fixed amount of data is high, that power required to record a fixed amount of data is low, and the like.

A device to which attention is paid as a digital storage device in recent years is a solid state device (hereinafter, called "SSD") using a semiconductor memory, centered on a flash memory. Since page data recording to/reading from the SSD is possible, the SSD includes such a matter that the data transmission rate is high as one of merits thereof, and a SSD for personal utilization in a personal computer or the like is frequently used because of this merit.

Furthermore, the SSD is expected as a storage device for business use requiring a high data transmission rate. However, since cost per bit (hereinafter simply referred to as "bit cost") is currently high, application of the SSD to a storage system for business use is not very popular. One of the reasons is that the semiconductor device is manufactured via many steps. And it is necessary to make a cell area per bit small to achieve a large capacity in the SSD, and micromachining technique is required to do this.

Therefore, in order to reduce the bit cost of the SSD, it is required to increase a recording capacity per chip while suppressing increase of manufacturing cost per chip.

One example is a 3D technology of a semiconductor device described in Japanese Patent Application Laid-open Publication 2008-160004 (Patent Document 1). In an ordinary 3D technology, devices each composed of one layer are manufactured along an X-Y direction of a semiconductor substrate in a two-dimensional manner, and they are stacked so as to have a three-dimensional structure by any method. In this method, however, though cell area per bit can be reduced, manufacturing cost per bit cannot be reduced.

On the other hand, in the method described in Patent Document 1, recording regions holding data and Si (silicon) channels introducing current into the recording regions are continuously formed along a vertical direction (Z direction) of a semiconductor substrate. Furthermore, a plurality of gate electrodes of MOS transistors for selecting one of the recording regions in the vertical direction is formed in a vertical direction. Furthermore, these structures are arranged along the X-Y direction of the semiconductor device in a two-dimensional manner. Selection from a plurality of structures arranged in the X-Y direction is performed by a bit line and a word in the same manner as the DRAM or the like. According to such a structure, the recording region is selected three-dimensionally so that a three-dimensional recording device is realized.

According to the 3D technology in the above-mentioned Patent Document 1, since the structure along the vertical direction (Z direction) of the semiconductor device can be manufactured by a collective process, and size reduction in the X-Y direction becomes unnecessary due to recording many bits in the vertical direction, it is possible to increase the recording capacity per chip while suppressing increase of manufacturing cost per chip.

In recent years, as one of alternative technologies of the above-mentioned flash memory, a phase change memory device has been proposed. This phase change memory device is obtained by applying, to a semiconductor memory, a principle of DVD-RAM, DVD-RW, and the like which is a rewritable optical disk which have been put in the market, and digital data is recorded by reversibly changing a state of a recording film, which is made of a phase change material such as chalcogenide, between an amorphous phase and a crystal phase.

In the case of the phase change memory device, Joule heat generated by causing current to flowing into the recording film is utilized for reversible change between the amorphous phase and the crystal phase. That is, when the recording film is changed from the crystal phase to the amorphous phase, the recording film is locally melted by causing high current to flow in the recording film. At this time, when a cooling rate of the melted region after stop of current supply is sufficiently fast, since kinetic energy of atoms before atoms form arrangement of minimal energy becomes small, an amorphous phase is formed in a local area within the recording film. On one hand, when the recording film is changed from the amorphous phase to the crystal phase, current smaller than the above is caused to flow in the recording film to heat the recording film up to a temperature at which the recording film is crystallized. Furthermore, when data is read out, a difference in electric resistivity between the amorphous phase and the crystal phase is detected. Incidentally, the details of the technology about the phase change memory device have been summarized, for example, in Patent Document 1.

An example where the 3D technology described in the above-mentioned Patent Document 1 has been applied to the phase change memory device is described in Japanese Patent Application Laid-open Publication 2010-165982 (Patent Document 2). The phase change memory device has a structure where a recording film made of phase change material and a Si channel layer is in contact with each other, and it is configured such that an inversion layer is locally formed in the Si channel layer by applying a voltage to the gate electrode of a MOS transistor so that current is caused to flow in the recording film locally.

The structure of the above-mentioned phase change memory device is shown in FIG. 2. The periphery of a select bit (recording bit) which performs recording is composed of a word line (upper electrode) 20, a bit line (lower electrode) 21, a central portion dielectric film 22, a phase change recording film 23, an interface layer 24, a Si channel layer 25, and a gate insulation film 26, and gate electrodes 27 of a MOS transistor for selection. The word line 20 and the bit line 21 are each made of a metal film such as, for example, W (tungsten), and the gate electrodes 27 are each made of, for example, a Si (silicon) film. Furthermore, the phase change recording film 23 is made of, for example, a $Ge_2Sb_2Te_5$ film, and the central portion dielectric film 22 and the gate insulation film 26 are each made of, for example, a $SiO_2$ (oxide silicon) film.

In the device shown in FIG. 2, the phase change recording film 23 is continuously formed in a vertical direction, but since the recording bit is determined in accordance with a voltage applied to the gate electrode 27, phase change takes place within an area which is indicated by a broken line in the phase change recording film 23 (which is in the vicinity of the respective gate electrodes 27). That is, the portions indicated by the broken line serve as recording bits.

Here, for example, when a voltage is applied to the gate electrode 27a of the MOS transistor so that the resistance of an area which is indicated by the broken line in the Si channel layer 25 becomes larger than that of the interface layer 24 and the phase change recording film 23, current passes through a path indicated by an arrow. In this way, since current can be introduced into a local portion of the phase change recording film 23 so as to form an inversion layer, it is possible to select a bit to be recorded and read.

Furthermore, in the device shown in FIG. 2, an interface layer 24 is provided between the phase change recording film 23 and the Si channel layer 25. From this, it is possible to suppress mutual diffusion between elements constituting the phase change recording film 23 and elements constituting the Si channel layer 25, and to hold the temperature of the phase change recording film 23 constant at the time of recording data.

That is, since the Si channel layer 25 is higher in thermal conductivity than the central portion dielectric film 22, the temperature in the phase change recording film. 23 becomes low on the side closer the Si channel layer 25 than the central portion dielectric film 22, so that enormous power is required in order to raise the temperature of the phase change recording film 23 on the side of the Si channel layer 25 to a high temperature. Therefore, in order to solve this problem, the interface layer 24 for suppressing excessive thermal diffusion from the phase change recording film 23 to the Si channel layer 25 is provided.

SUMMARY OF THE INVENTION

One of the problems in the phase change memory device having a three-dimensional structure as shown in FIG. 2 lies in that since the phase change recording film is continuously formed in the vertical direction of the semiconductor substrate, heat generated from the recording bit diffuses to a non-selected bit adjacent to the recording bit, so that data in the adjacent bit is easily erased, namely, so-called thermal disturbance easily occurs.

That is, as described above, since thermal conductivity of the Si channel layer is high, when heat generated at the recoding bit is introduced into the Si channel layer, the heat diffuses to the adjacent bit along the Si channel layer. Here, when it is assumed that the adjacent bit is put in a crystal phase and the phase change recording film is locally melted in order to change the recording bit into the amorphous phase, it is thought that heat generated at the recording bit may erase the data in the adjacent bit.

This matter was calculated by a computer simulation. In this calculation, it is assumed that, in the device shown in FIG. 2, the central portion dielectric film 22 and the gate insulation film 26 are made of $SiO_2$, the phase change recording film 23 is made of $Ge_2Sb_2Te_5$, the interface layer 24 is made of SiSb, the word line 20 and the bit line 21 are made of W (tungsten), and the gate electrode 27 is made of Si (silicon). A voltage pulse was applied to this device and the temperature generated by Joule heat was calculated. Assuming that the voltage pulse had a rectangular shape, a length thereof was set to 30 ns.

Here, the temperature at the minimum temperature point A of the recording bit and the temperature at the maximum attainment temperature point B of the adjacent bit shown in FIG. 2 are important and respectively represented as $T_{recmin}$ and $T_{nbrmax}$. $T_{recmin}$ must be at least 630° C. (degrees Celsius) which is the melting point of the $Ge_2Sb_2Te_5$ (the phase change recording film 23).

However, when a voltage pulse is applied to the phase change recording film 23 so as to achieve $T_{remin}$ of 630° C., there is such a possibility that due to manufacturing variation of the device or the like, the temperature of the phase change recording film 23 does not rise sufficiently so that a region which is not melted but crystallized occurs in the phase change recording film 23. The manufacturing variation of the device depends on precision of the manufacturing process of the device, but it is thought that manufacturing error generally occurs in a range of 5 to 10%. It is desirable from the fact that $T_{recmin}$ is set to about 700° C. As the result of simulation which was performed under this condition, it was calculated that $T_{nbrmax}$ was 130° C.

Next, the problem caused by the value will be described. Here, it is assumed that the adjacent bit is in an amorphous phase, and the recording bit is changed to an amorphous phase. In this case, when data is recorded in the recording bit, the adjacent bit must be prevented from being crystallized. In order to consider this matter, a crystallization probability is examined from a theoretical standpoint.

A time dependency $\chi(t)$ of the crystallization probability is expressed as follows:

$$\chi(t) = 1 - \exp\left[-\left(\int k(t)dt\right)\right] \quad (1)$$

$$k(T) = v\exp\left[-\frac{E_a}{k_B T}\right] \quad (2)$$

Here, "t" is time, $\chi(t)$ is crystallization probability after elapsing of time "t", "n" is index regarding dimension of crystal growth, "v" is frequency, "$E_a$" is activation energy, "$k_B$" is Boltzmann constant, and "T" is temperature. The reason why "k" is made dependent on time in the expression (1) and "k" is made dependent on temperature in the expression (2) is because the temperature "T" depends on time and "k" is integrated regarding time in the expression (1).

The values of the parameters in the above expressions are reported in detail, for example, in non-patent document "Journal of Applied Physics, 89, pp. 3168 to 3176 (2001)". According to this document, $E_a$=2.0±0.2 eV (electron volt), $v$=(1.5±0.3)×$10^{22}s^{-1}$, and n=2.5 in the phase change recording film ($Ge_2Sb_2Te_5$) considered here. In another document, values such as $E_a$=2.4 eV and $E_a$=2.9 eV were reported. The $E_a$ largely becomes engaged in the crystallization probability, where such a tendency appears that the lower $E_a$, the easier crystallization becomes. Considering that $E_a$ becomes lower depending on the film formation condition of the phase change recording film, $E_a$=2.0 eV which is the minimum value in a plurality of documents is adopted.

Furthermore, the length of the recording bit in the Z direction and the length of the gate electrode in the Z direction are set to 30 nm (nanometers), respectively. These values depends on the recording capacity targeted by the device, and the smaller the values, the larger the thermal disturbance becomes, but when the value becomes smaller than 30 nm, it becomes difficult for the MOS transistor to form an inversion layer in the Si channel layer, and results in a thought that the minimum value is 30 nm.

Furthermore, the distance between the Si channel layer and the gate electrode is set to 10 nm. When the distance between the both is smaller than 10 nm, an insulation performance of the insulation film becomes lower, and when the distance becomes larger than 10 nm, electric field formed by the gate electrode spreads in the Si channel layer, so that the length of the inversion layer formed in the Si channel layer becomes long.

It is considered using the above expressions that how much $T_{nbrmax}$ should be set when $T_{recmin}=700°$ C. is set. Here, in the device shown in FIG. 2, when the thermal conductivity of the Si channel layer is high and the voltage pulse is rectangular, since the temperature within the phase change recording film reached equilibrium within 1 ns, the temperature change of $T_{nbrmax}$ is closely related to the rectangle while taking no account of rising/falling time of the temperature and integration in Expression 1 is set to $k \times t_{pls} \times N_{rec}$. The term $t_{pls}$ is a voltage pulse width, where $t_{pls}$ is 30 ns. The term $N_{rec}$ is the number of rewritings.

The calculation result is shown in FIG. 3. In FIG. 3, the relationship between $T_{nbrmax}$ and $\chi$ are plotted to various values of $N_{rec}$. Here, values of $\chi$ and $N_{rec}$ to be required become problematic. These values strongly depend on the performance required for the device and system, but assumption is made as follows:

Regarding $\chi$, the value equal to $10^{-4}$ required as the maximum value is adopted as an error rate before error correction when Reed-Solomon code which is a method for error correction of digital data is used so that $\chi \leq 10^{-4}$ is set. Regarding $N_{rec}$, $10^6$ times is sufficient as the number of times of rewriting for a device for personal use, but it is considered that $10^{12}$ times is required as the number of times of rewriting for a device for business SSD.

Considering $T_{nbrmax}=130°$ C. which is the result of the above computer simulation together with the result shown in FIG. 3, $\chi=10^{-4}$ is reached in $N_{rec}=10^8$ to $10^{10}$ times. The value is insufficient for a device for business SDD. As described above, if $10^{12}$ times is required as the times of rewriting, $T_{nbrmax} \leq 80°$ C. is required from FIG. 3.

An object of the present invention is to provide a technique for suppressing thermal disturbance of a phase change memory device having a three-dimensional structure.

Another object of the present invention is to provide a technique of increasing a recording capacity per chip while suppressing increase of bit cost of a phase change memory device having a three-dimensional structure.

The above-mentioned objects and other objects and novel features of the present invention will become apparent from the description of the specification and the accompanying drawings.

An outline of a representative one of the inventions disclosed in this application will be briefly described in the following manner.

The above problem is solved by applying a material having a high thermal conductivity to a gate insulation film of a MOS transistor for selection in a phase change memory device having a three-dimensional structure.

FIG. 1 is a sectional view of its substantial part of a phase change memory device according to the present invention. As shown in FIG. 1, a periphery of a recording bit is composed of a word line (upper electrode) 10, a bit line (lower electrode) 11, a central portion dielectric film 12, a phase change recording film 13, an interface layer 14, a Si channel layer 15, peripheral dielectric films 18, a gate insulation film 16 and gate electrodes 17 of a selection MOS transistor. A more detailed structure and a manufacturing method of the phase change memory device will be described hereinafter.

Here, in the case where the thermal conductivity of the gate insulation film 16 is $\kappa_{diel}$, a temperature T at the minimum temperature point of the recording bit is 700° C., and a distance between the Si channel layer 15 and the gate electrode 17 of the selection MOS transistor, namely, an effective film thickness $d_{diel}$ of the gate insulation film 16 is 10 nm, a simulation result regarding a relationship between a thermal conductivity $\kappa_{diel}$ of the gate insulation film 16 and a maximum attainment temperature point $T_{nbrmax}$ of an adjacent bit is shown in FIG. 4.

According to this result, $T_{nbrmax} \leq 80°$ C. is found at $\kappa_{diel} \geq 5$. This fact can be easily understood from considering such a point that heat generated at the phase change recording film 13 is introduced into the Si channel layer 15 but the heat is introduced into the gate electrode 17 with a high thermal conductivity via the gate insulation film 16 so that the heat is sufficiently diffused. Furthermore, by considering the mechanism, it can also be understood that the thermal conductivity of the peripheral dielectric film 18 hardly affects the value of $T_{nbrmax}$. Therefore, the material of the peripheral dielectric film 18 may be the same as that of the gate insulation film 16, or the former may be different from the latter. Furthermore, the material of the gate electrode 17 hardly affects the value of $T_{nbrmax}$. This is because heat which has reached the gate electrode 17 diffuses sufficiently since a material having a high thermal conductivity, such as W or Si is used as the material of the gate electrode 17.

As described above, it is shown that the thermal conductivity of the gate insulation film 16 is required to be 5 W/m·K or more, but since the thermal conductivity of the gate insulation film material ($SiO_2$) adopted in Patent Document 1 or Patent Document 2 is about 1.5 to 3 W/m·K, this value is insufficient to satisfy this requirement. For example, BN, $Al_2O_3$, AlN, $TiO_2$, $Si_3N_4$, ZnO, and the like are proposed as an insulating material satisfying this requirement. And a mixture of these materials can be adopted. This is because the thermal conductivity of the mixture of the dielectrics shows an intermediate value of the thermal conductivities of the respective materials. Furthermore, in the case of the mixture of the dielectrics, a desirable thermal conductivity can be obtained by adjusting a mixing ratio of these materials.

In the above simulation, the film thickness $d_{diel}$ of the gate insulation film 16 was set to 10 nm, but this value should be determined according to the electrical insulation property of the gate insulation film 16, and depends on the design of the device. Therefore, the thermal conductivity $\kappa_{diel}$ of the gate insulation film 16 should be determined using the value of this $d_{diel}$ as a parameter.

The simulation result of the relationship between the film thickness $d_{diel}$ of the gate insulation film 16 and the minimum thermal conductivity $\kappa_{dielmin}$ required for the gate insulation film 16 is shown in FIG. 5. Here, a fitting curve to the simulation result to each $d_{diel}$ is also shown. This fitting curve was calculated using least squares method from the following expression (3).

$$\kappa_{diel} \geq -9.36 \times 10^{-3} d_{diel}^2 + 5.72 \times 10^{-1} d_{diel} - 1.03 \times 10^{-1} \qquad (3)$$

Here, the reason why $\kappa_{dielmin}$ is subjected to fitting by a quadratic expression (3) is described qualitatively. First, one-dimensional thermal conduction is considered simply. In general, a heat source is a point, an initial temperature in a region other than the heat source is zero, and when heat diffuses isotropically, the temperature T(x, t) at the distance x after elapsing of time t can be expressed by the following expression (4).

$$T(x, t) \propto \frac{\exp(-x^2/D^2)}{D} \quad (4)$$

This matter is described in detail, for example, in "Journal of Applied Physics, Vol. 66, pp. 1530-1543 (1989)" or the like.

Furthermore, the case of heat conduction to three dimensions, it is only necessary to substitute $x^2$ in the expression (4) with $(x^2+y^2+z^2)$. Here, D is a constant including the thermal conductivity, and it is generally an amount called "thermal diffusivity", but it can be thought that D is approximately proportional to the thermal conductivity. In the case considered in this invention, heat diffusing in the direction of the Si channel layer and heat diffusing in the direction of the gate electrode are sorted out from each other, and it is desirable that as much heat as possible diffuses in the direction of the gate electrode. That is, the temperature T(x, t) of the gate electrode is required to be raised to a certain value or more. When the value is represented as C, the following expression (5) is required by solving the expression (4).

$$\sqrt{D^2\mathrm{Ln}(DC)} \geq d_{diel} \quad (5)$$

From this expression (5), if Ln(DC) falls in an approximately constant range, $d_{diel}$ and D, namely, $\kappa_{dielmin}$ are approximately proportional to each other, but a deviation from the proportional relationship occurs due to existence of the logarithmic term. Fitting of the relationship between $D_{diel}$ and $\kappa_{dielmin}$ is made possible by correcting an amount corresponding to the deviation by a quadratic expression. Incidentally, in the expression (3), the reason why the quadratic coefficient is small is because the deviation is slight.

In an actual MOS transistor, when the film thickness of the gate insulation film is thin, the insulation effect becomes small, and it encounters a problem that leakage occurs. Therefore, though application of a high-k material or the like is tried, the film thickness of the gate insulation film is generally 5 nm or more. That is, it is understood from the expression 3 and FIG. 5 that an insulation film material having the thermal conductivity of 2.5 W/m·K or more is demanded.

Insulation film materials satisfying this demand are shown in Table 1. The thermal conductivity of the gate insulation film material ($SiO_2$) used in the related art is typically about 1.4 W/m·K, and the gate insulation film material ($SiO_2$) does not satisfy the demand of the present invention, while the other materials in Table 1 satisfy the demand of the present invention.

TABLE 1

| Material Name | Thermal Conductivity (W/m · K) |
|---|---|
| $SiO_2$ | 1.4 |
| $TiO_2$ | 5~9 |
| $Al_2O_3$ | 20~35 |
| ZnO | 20~50 |
| $Si_3N_4$ | 30 |
| BN | 30~35 |
| AlN + $Y_2O_3$ | 150 |
| AlN | 170~200 |

Incidentally, it is well known that, among dielectrics, AlN is a material showing the highest thermal conductivity, and that AlN easily mixes with oxygen, which results in reduction of the thermal conductivity of AlN due to phonon scattering caused by the mixing. It is described, for example, in "Journal of American Ceramic Society, 80, pp. 1421-1435 (1997)" that this problem can be solved by mixing $Y_2O_3$ into AlN at a rate of several percentages.

Furthermore, when an actual device is manufactured, adhesiveness of a stacked layer film is one of problems. It is known that adhesiveness between the Si channel layer and the gate insulation film ($SiO_2$) in the related art is excellent, but when an alternative material for silicon oxide such as described in Table 1 is used, adhesiveness or mutual diffusion between elements may be problematic depending on manufacturing conditions. In particular, since the Si channel layer and the vicinity thereof reach a high temperature, there is a possibility that these problems become serious. These problems can be solved by providing a thin film made of $SiO_2$ between the Si channel layer and the alternative material shown in Table 1.

That is, since $SiO_2$ and the other alternative materials are the same dielectric, adhesiveness between these materials is excellent, and since $SiO_2$ is a stable material, mutual diffusion of elements is also suppressed. As described above, however, since the thermal conductivity of $SiO_2$ is low, heat conduction to the gate electrode is suppressed by providing the thin film made of $SiO_2$.

Here, the simulation result of the relationship among the film thickness $d_{SiO2}$ of $SiO_2$, the film thickness $d_{diel}$ of the gate insulation film including $SiO_2$, and the required minimum value $\kappa_{dielmin}$ of the thermal conductivity of the alternative material for silicon oxide is shown in FIG. 6. Here, the case of $d_{SiO2}$=0 nm is the same as the case shown in FIG. 5 and by the expression (3). A broken line in FIG. 6 shows a fitting result like the case shown in FIG. 5. Here, the following expressions (6), (7), and (8) are used for fitting.

$$\kappa \geq A \exp(B d_{SiO2}) \quad (6)$$

$$A = -9.3608 \times 10^{-3} d_{diel}^2 + 5.72039 \times 10^{-1} d_{diel} - 1.03325 \times 10^{-1} \quad (7)$$

$$B = -2.04729 \times 10^{-1} \ln(d_{diel}) + 1.33269 \quad (8)$$

Here, as will be seen from the expression (6), an exponential function is used to $d_{SiO2}$. The reason is because since the thermal conductivity of $SiO_2$ is low, when $d_{SiO2}$ increases, heat cannot be diffused sufficiently unless the thermal conductivity of the alternative material is made very large. Furthermore, in the case of $d_{SiO2} \geq 4$ nm, the required minimum value $\kappa_{dielmin}$ satisfying the demand of the present invention can not be obtained within a range of 200 W/m·K or less. Therefore, $d_{SiO2} \leq 4$ nm is demanded.

In the above explanation, attention is paid to thermal disturbance to the adjacent cell in Z direction. However, in the above configuration, there is such a concern that since heat is diffused to the gate electrode, thermal disturbance due to introduction to the adjacent cell in the X-Y direction through the gate electrode occurs. However, in the simulation result, it was confirmed that most temperature in a distance from one end of the gate electrode within 10 nm became close to the room temperature. Thereby, it is shown that even if heat is diffused to the gate electrode, the thermal disturbance to the adjacent cell in the X-Y direction is not problematic.

This result can be interpreted in the following manner. In the device structure shown in FIG. 1, the phase change recording film 13, the interface layer 14, and the Si channel layer 15 are thin in film thickness, and their film thicknesses are set in a range of several nanometers to 10 nm. On the other hand, the minimal film thickness of the gate electrode 17 is 30 nm and the length thereof in the X-Y direction is 30 nm or more. That is, since a volume of the gate electrode 17 is sufficiently large as compared to a volume of the heat generating portion of the phase change recording film 13, so that the thermal capacity of the gate electrode 17 is sufficiently large, the density of thermal energy can be reduced. Therefore, it is possible to sufficiently reduce the temperature in the gate electrode 17.

An advantageous effect obtained by the inventions described in this application will be briefly described below.

In a phase change memory device with a three-dimensional structure which can record a large volume of digital data therein, the problem about the thermal disturbance where data is erased due to data rewriting in an adjacent bit can be solved.

That is, by adjusting the film thickness and the thermal conductivity of the gate electrode film in the selection MOS transistor, heat conducted along the Si channel layer can be diffused efficiently, and even if data rewriting is performed $10^{12}$ times, data erase can be suppressed sufficiently.

BRIEF DESCRIPTIONS OF THE DRAWINGS

DESCRIPTIONS OF THE PREFERRED EMBODIMENTS

Figure 1:
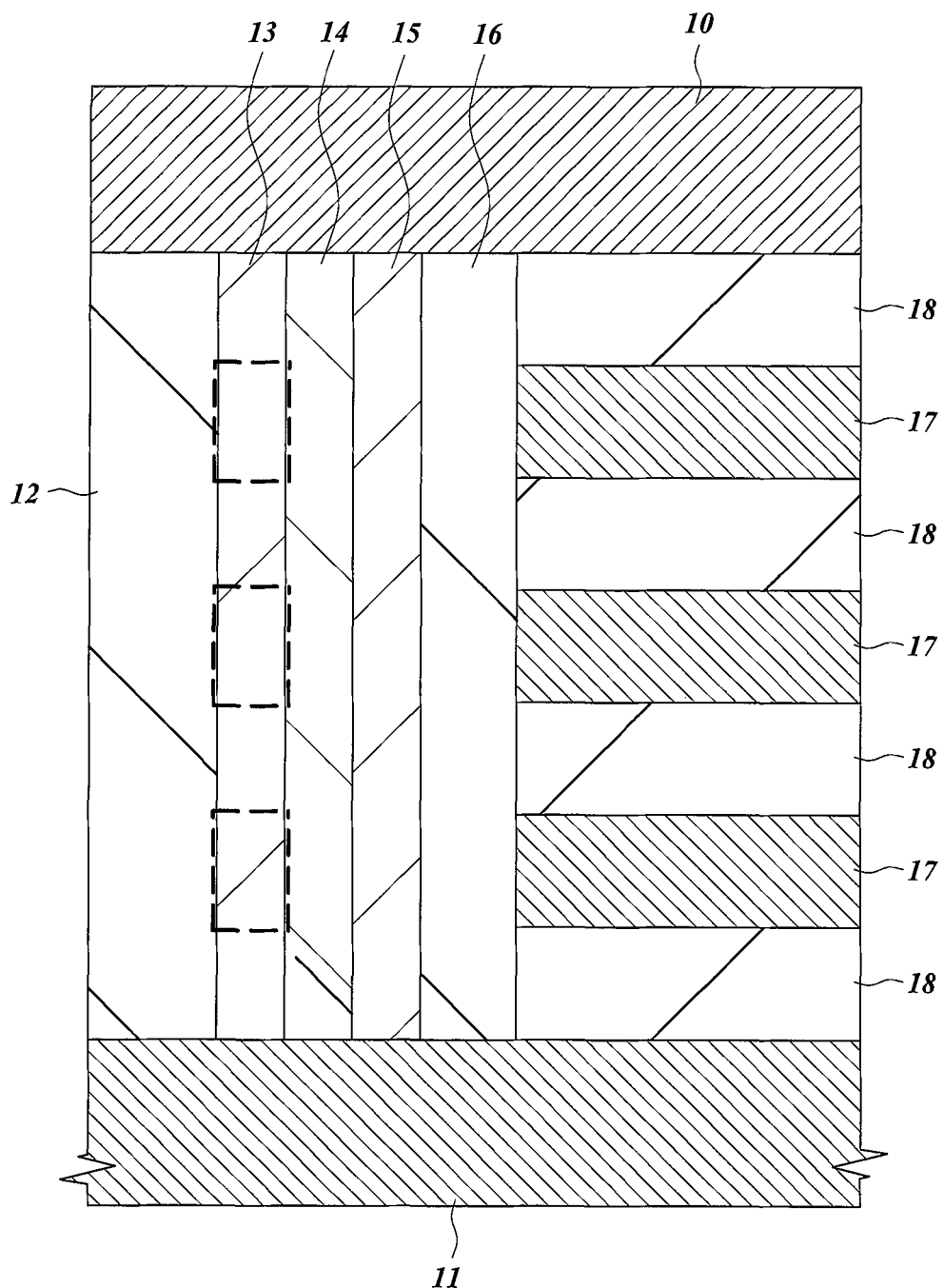
FIG. 1 is a sectional view showing a substantial part of a phase change memory device according to the present invention.
Figure 2:
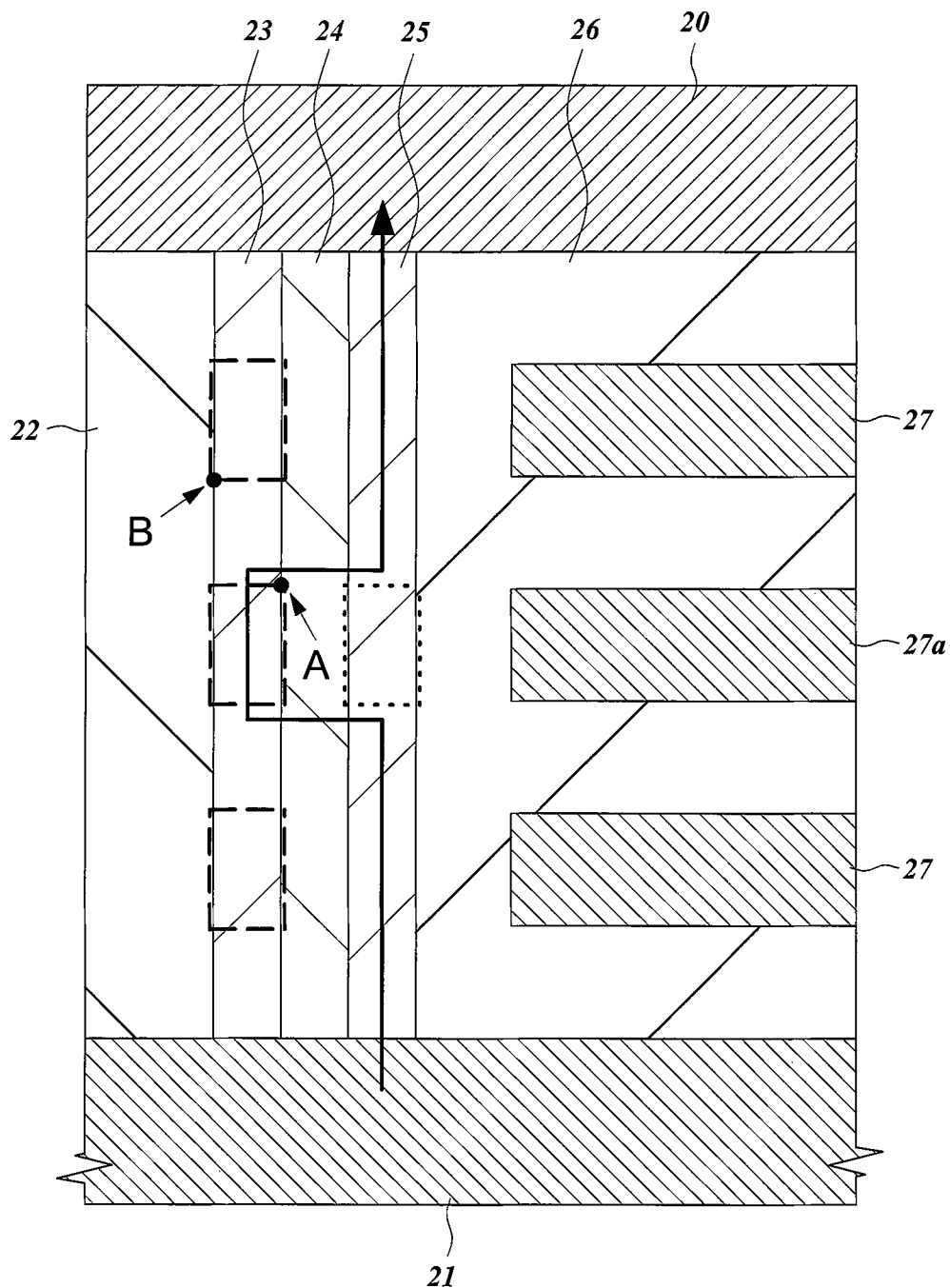
FIG. 2 is a sectional view showing a substantial part of a conventional phase change memory device.
Figure 3:
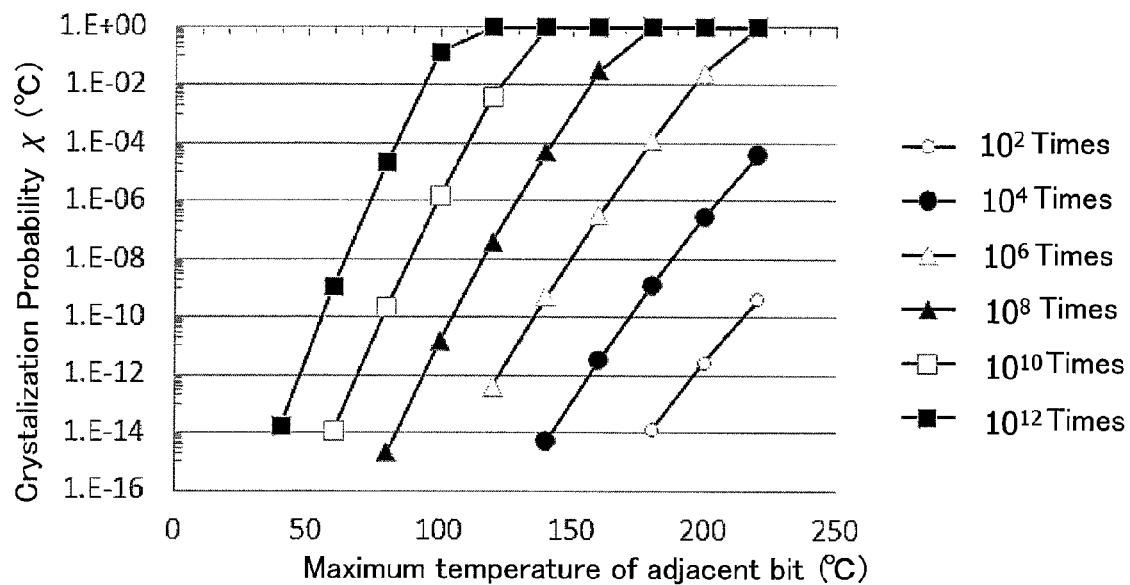
FIG. 3 is a graph showing a simulation result regarding a relationship among the maximum temperature $T_{nbrmax}$ in an adjacent bit, the crystallization probability $\chi$, and the times of rewriting when an amorphous mark is recorded in a recording bit.
Figure 4:
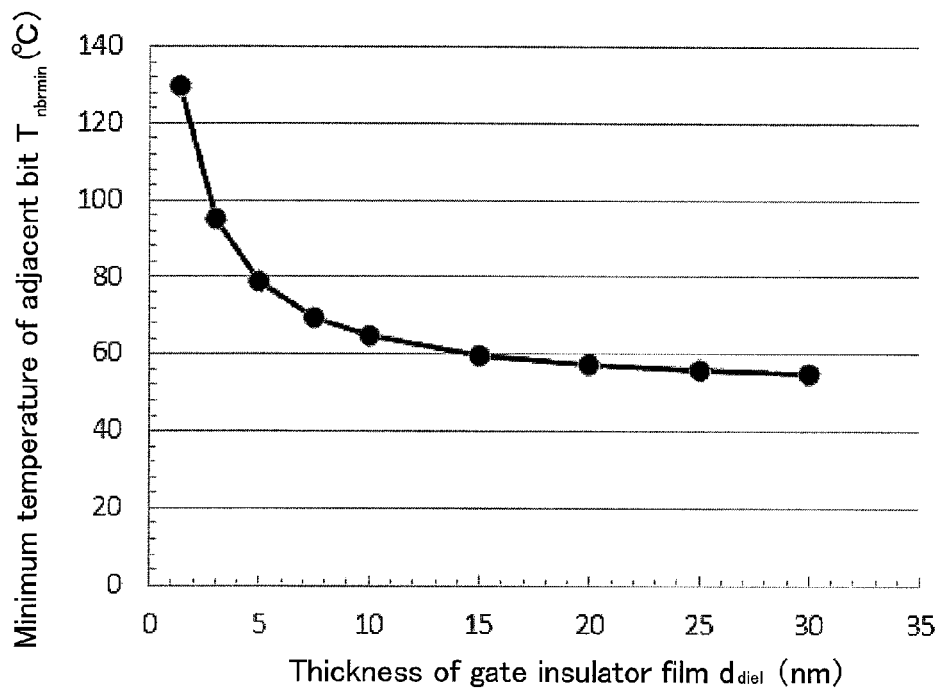
FIG. 4 is a graph showing a simulation result regarding a relationship between a thermal conductivity $\kappa$ of a gate insulation film and a maximum temperature $T_{nbrmax}$ of an adjacent bit, provided that the film thickness of a gate insulation film is 10 nm.
Figure 5:
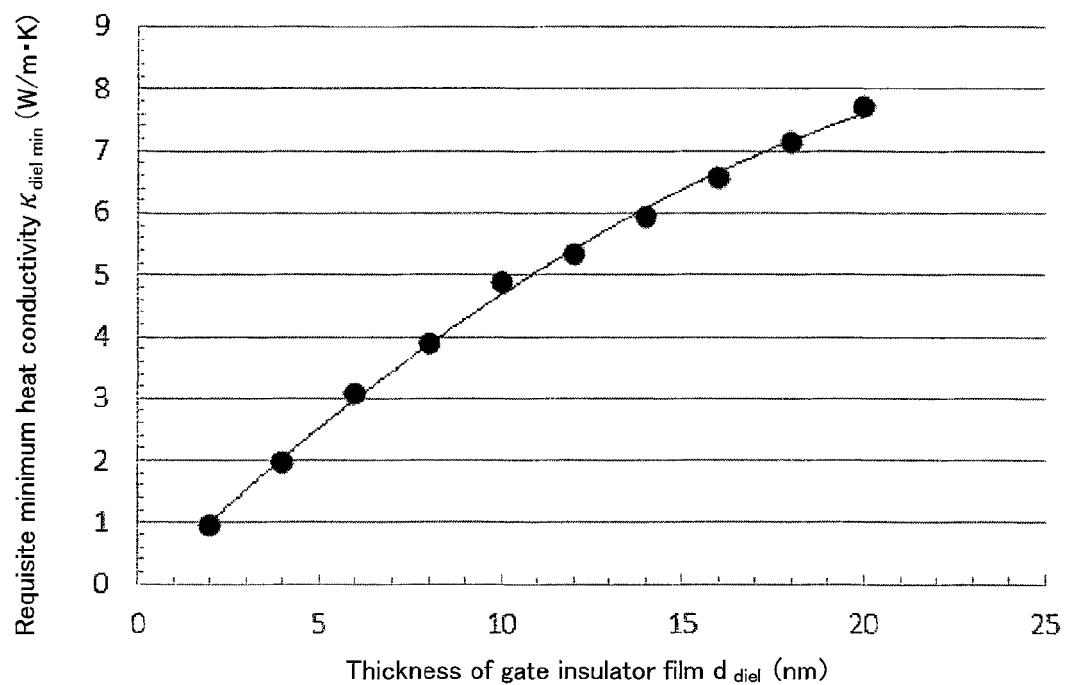
FIG. 5 is a graph showing a simulation result regarding a relationship between a film thickness $d_{diel}$ of a gate insulation film and a required minimal thermal conductivity $\kappa_{dielmin}$ of the gate insulation film.
Figure 6:
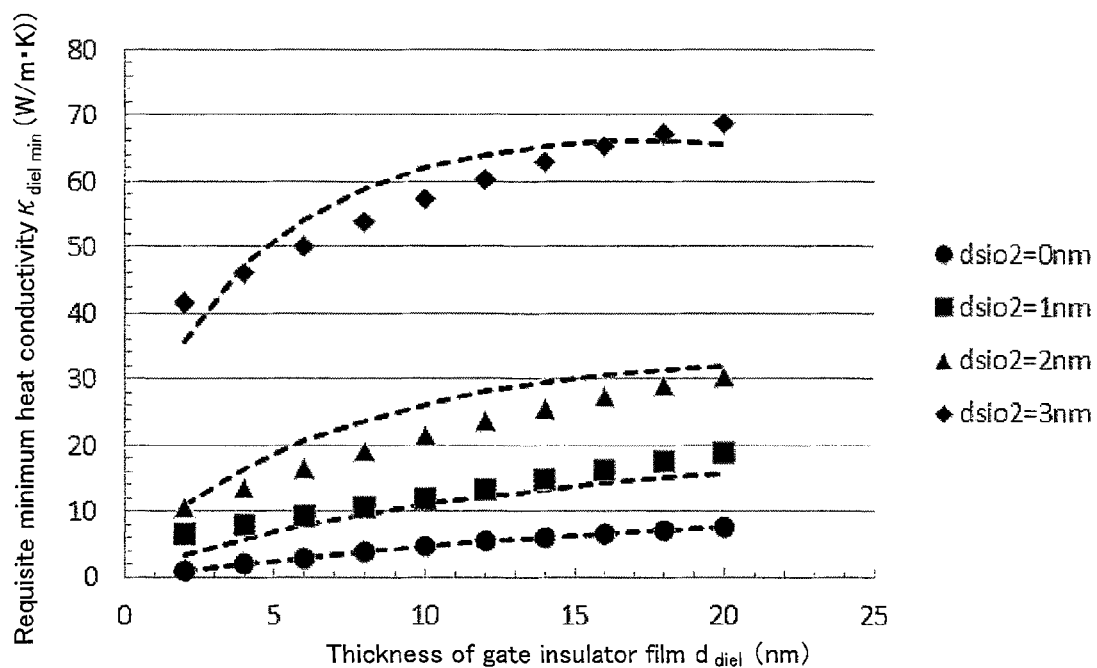
FIG. 6 is a graph showing a simulation result regarding a relationship among a film thickness $d_{SiO2}$ of a SiO$_2$ film adjacent to a Si channel layer, a film thickness $d_{diel}$ of a gate insulation film, and a required minimal thermal conductivity $\kappa_{dielmin}$ of the gate insulation film.

Hereinafter, embodiments of the present invention will be described in detail with reference to the accompanying drawings. Additionally, note that components having the same function are denoted by the same reference symbols throughout the drawings for explaining the embodiments, and the repetitive description thereof will be omitted. Furthermore, in the embodiments, explanation about the same or similar parts will not be repeated in principle. Furthermore, in the drawings for explaining the embodiments, hatching may be applied to even a plan view for easy understanding of configuration of this invention.

(First Embodiment)

Figure 7:
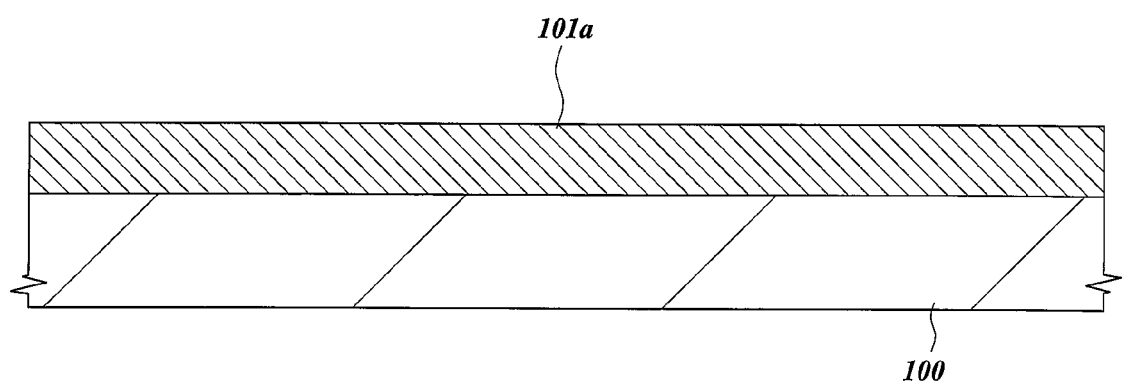
FIG. 7 is a sectional view of its substantial part for explaining a manufacturing method of a phase change memory device according to an embodiment of the present invention.
Figure 8:
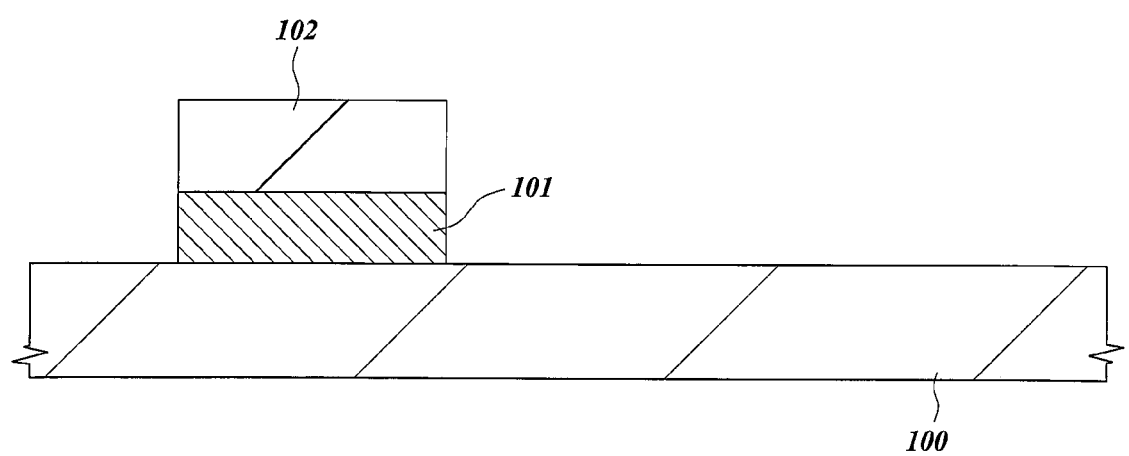
FIG. 8 is a sectional view of its substantial part for explaining the manufacturing method of the phase change memory device in a process continuous from that of FIG. 7.
Figure 9:
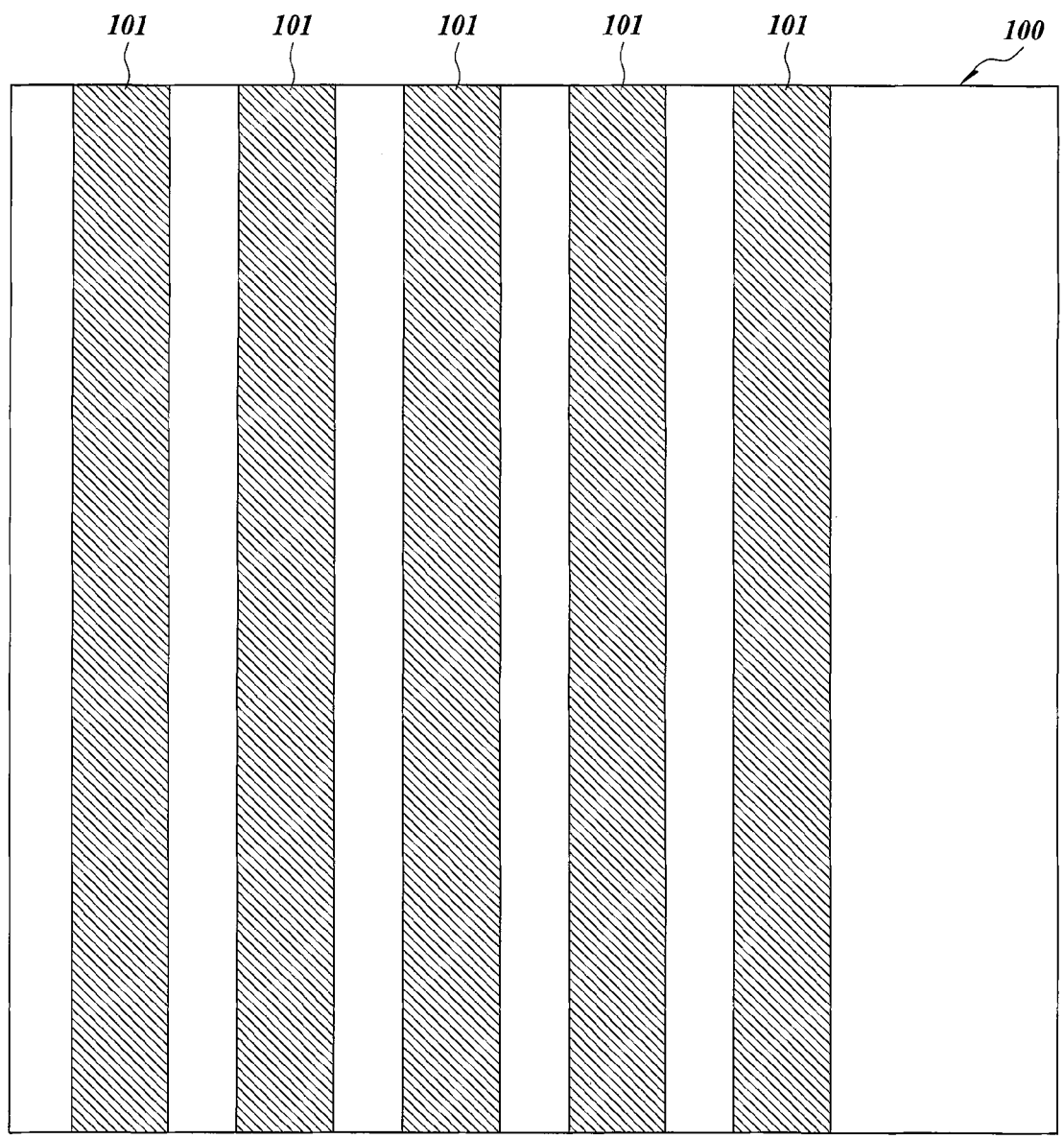
FIG. 9 is a plan view of its substantial part for explaining the manufacturing method of the phase change memory device in a process continuous from that of FIG. 7.

First of all, a manufacturing method of a phase change memory device shown in FIG. 1 will be described. First, as shown in FIG. 7, a tungsten film (hereinafter simply refer to "W film") 101a having a film thickness of 50 nm is deposited on a main surface of a semiconductor substrate 100 composed of a single crystal silicon by a sputtering method, and a bit line 101 serving as a lower electrode is then formed by patterning the W film 101a by a reactive ion etching (RIE) utilizing a photoresist film 102 as a mask, as shown in FIG. 8. In this embodiment, a bit line 101 having line-and-space patterns as shown in FIG. 9 is formed using an immersion lithography apparatus having an ArF laser as a light source. Furthermore, in this embodiment, a repetition period of the line-and-space patterns is set to 90 nm, and for reasons which will be described below, a line width of the bit line 101 is 65 nm, and its space width is 25 nm.

Figure 10:
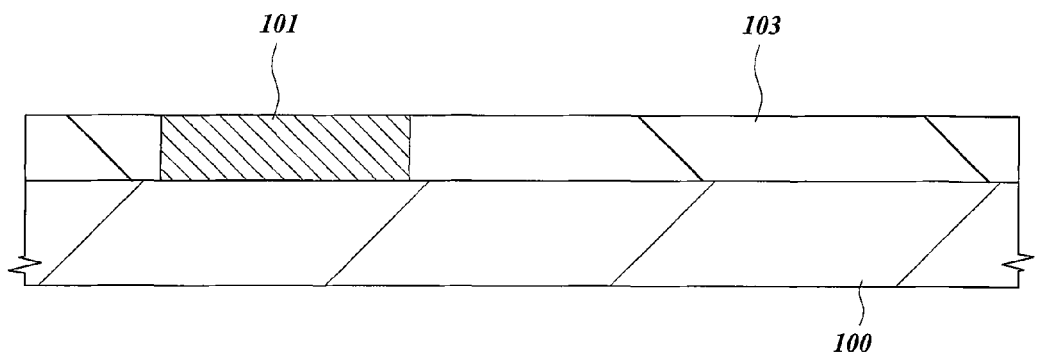
FIG. 10 is a sectional view of its substantial part for explaining the manufacturing method of the phase change memory device in a process continuous from that of FIG. 8.
Figure 11:
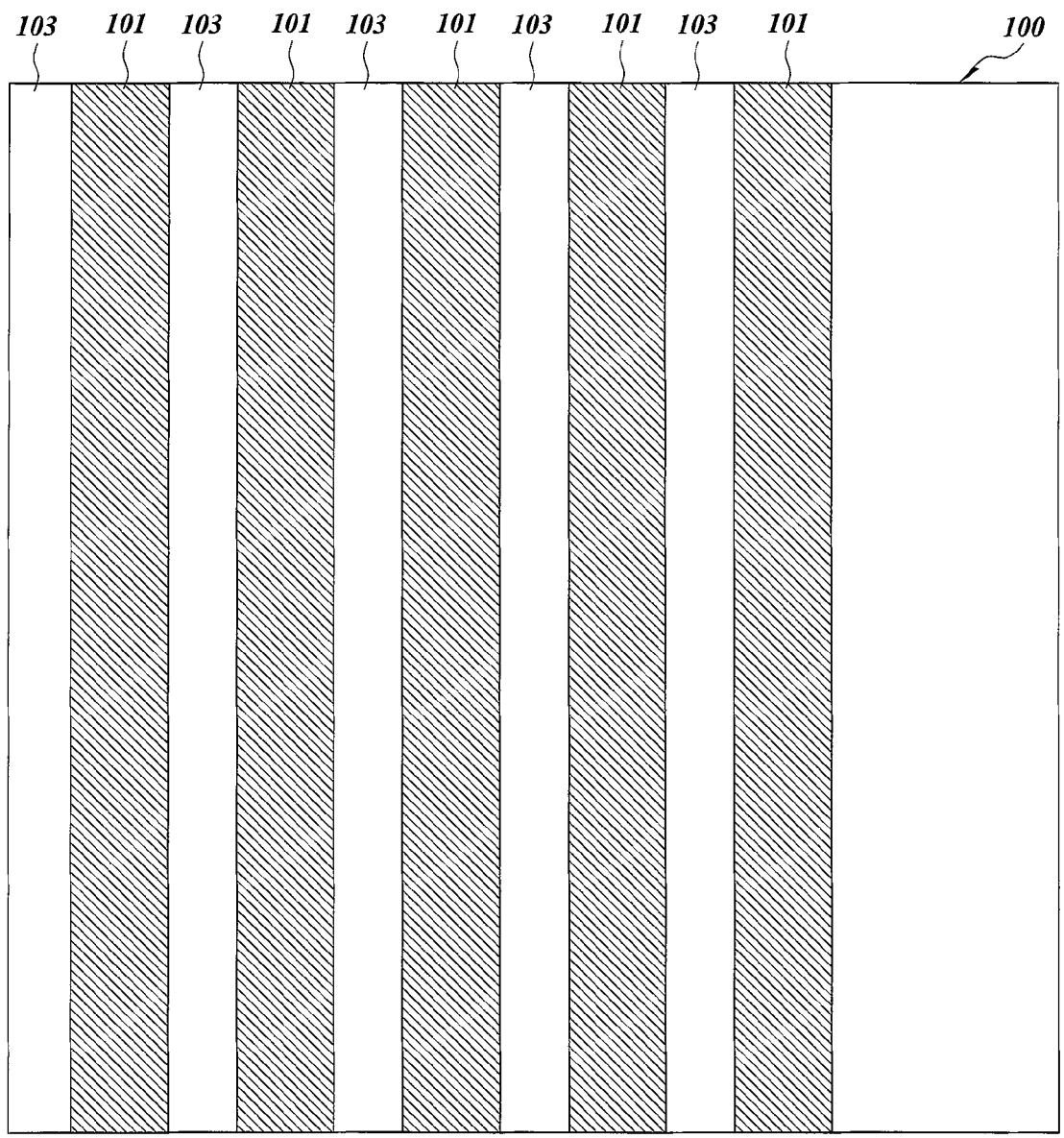
FIG. 11 is a plan view of its substantial part for explaining the manufacturing method of the phase change memory device in a process continuous from that of FIG. 9.

Next, after the photoresist film 102 is removed, as shown in FIGS. 10 and 11, a silicon dioxide film ($SiO_2$ film) 103 is deposited on the semiconductor substrate 100 by a chemical vapor deposition (CVD) method, and the $SiO_2$ films 103 are left in the space regions in the bit line 101 by planarizing the $SiO_2$ film 103 by a chemical mechanical polishing (CMP) method.

Figure 12:
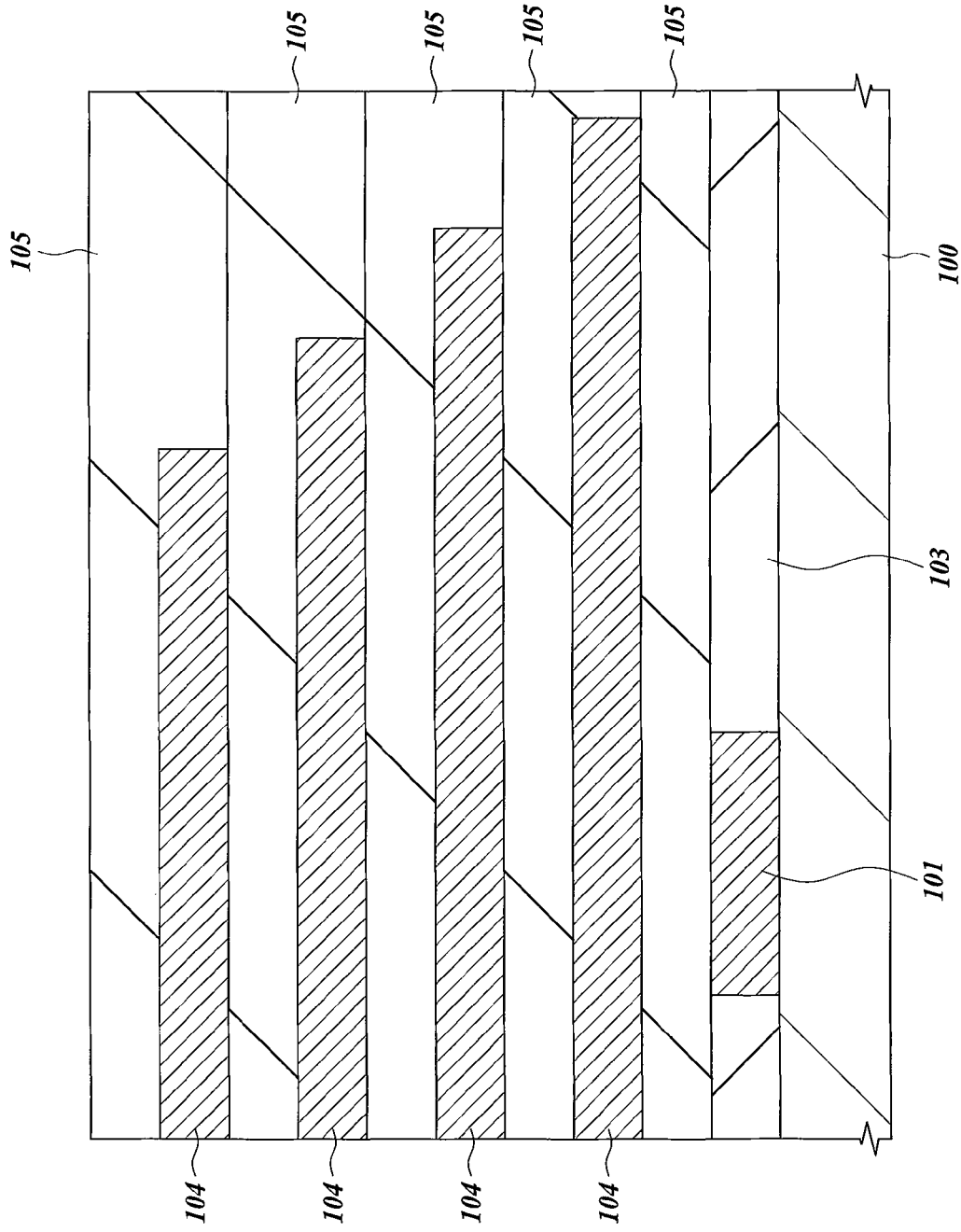
FIG. 12 is a sectional view of its substantial part for explaining the manufacturing method of the phase change memory device in a process continuous from that of FIG. 10.

Next, as shown in FIG. 12, gate electrodes 104 and peripheral dielectric films 105 adjacent to the gate electrodes 104 are formed on the semiconductor substrate 100. In this embodiment, using a W film having a film thickness of 30 nm as a gate electrode material and using an $Al_2O_3$ film having a film thickness of 30 nm as dielectric, the W film and the $Al_2O_3$ film are alternately stacked for four periods by a sputtering method. In formations of four layered gate electrodes 104, masks are used so that the lengths of these gate electrodes 104 in a lateral direction differ from one another. The gate electrodes 104 are arranged so as to extend in a direction approximately perpendicular to the bit lines 101.

Figure 13:
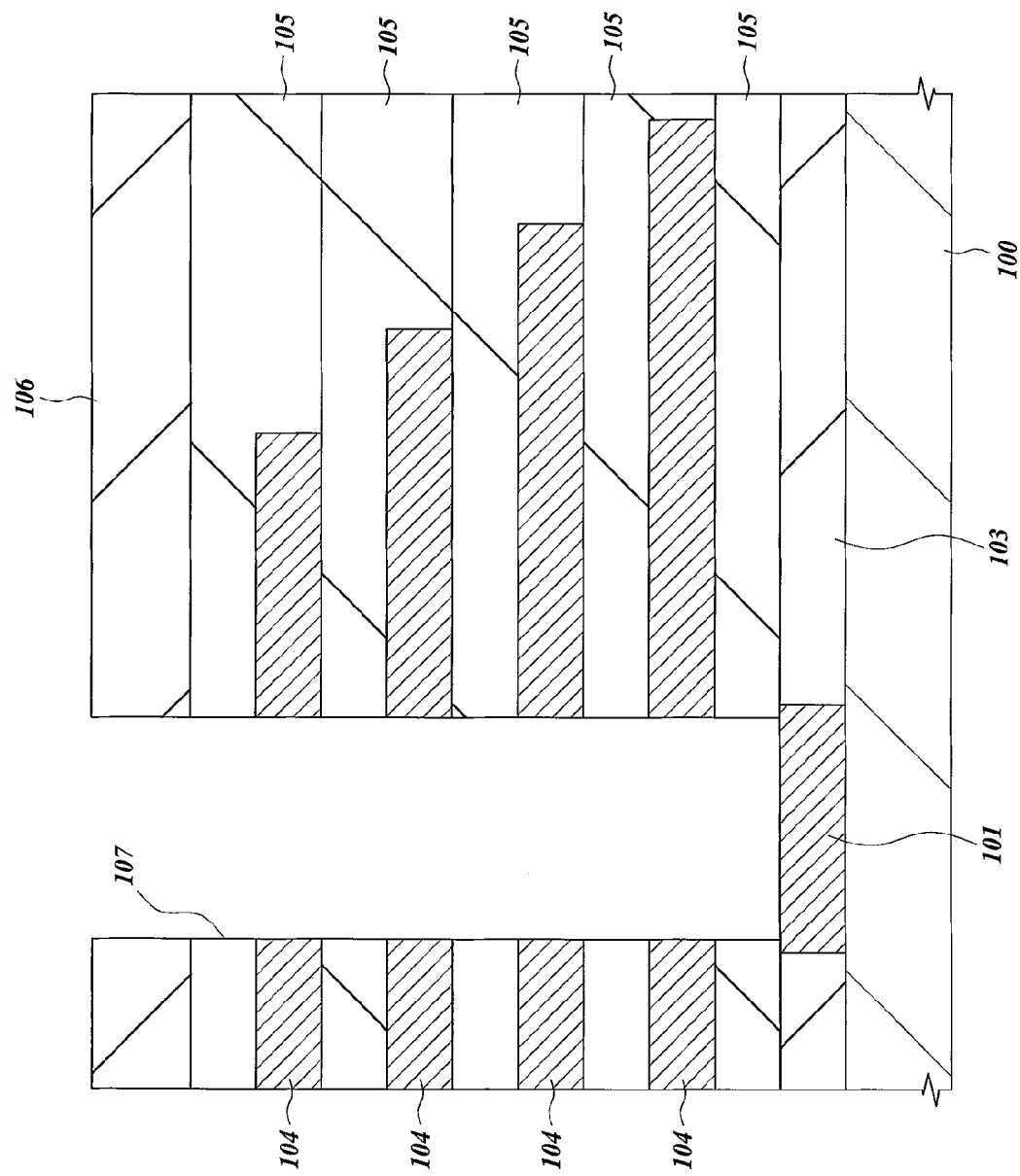
FIG. 13 is a sectional view of its substantial part for explaining the manufacturing method of the phase change memory device in the process continuous from that of FIG. 12.
Figure 14:
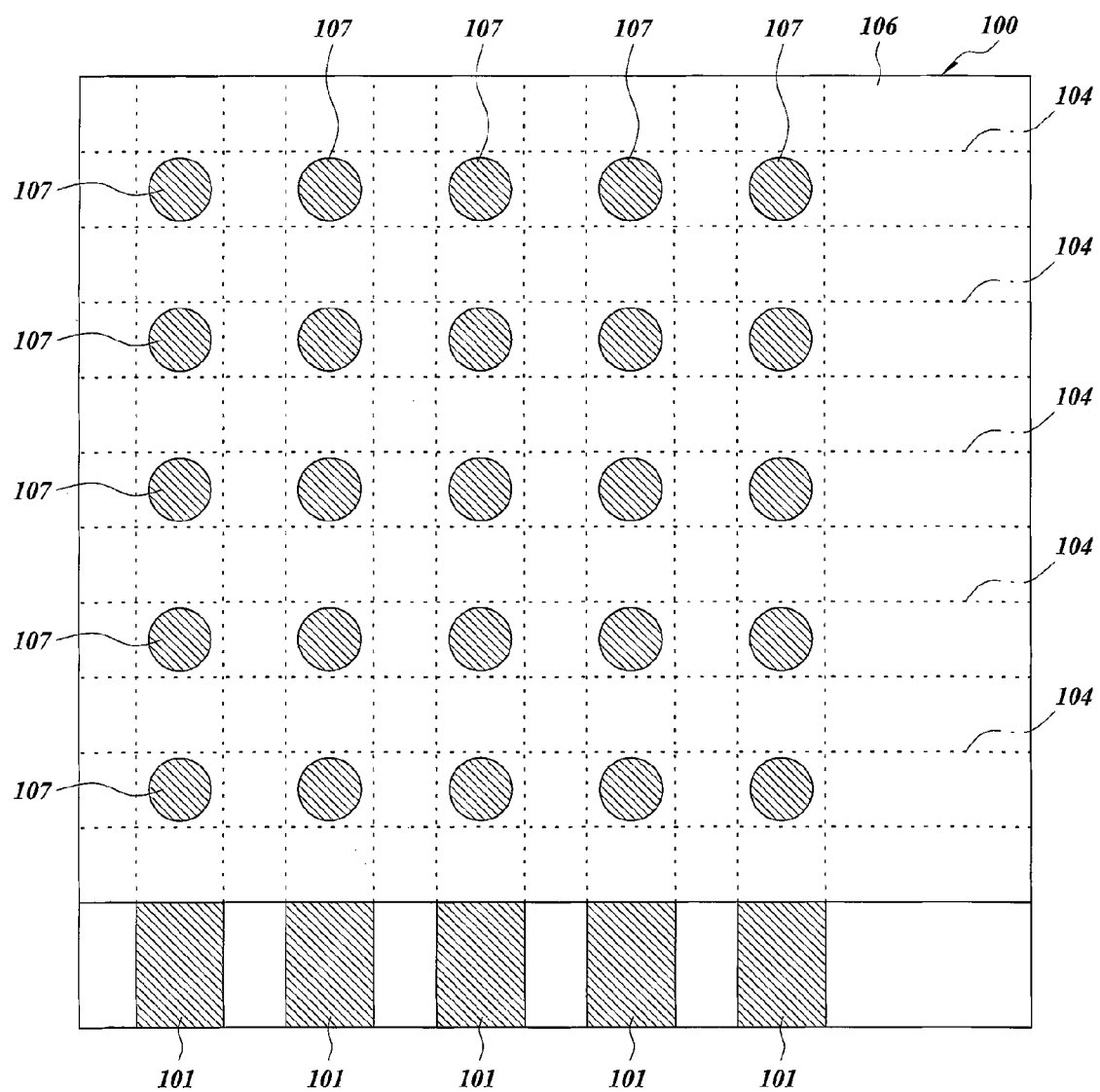
FIG. 14 is a plan view of its substantial part for explaining the manufacturing method of the phase change memory device in a process continuous from that of FIG. 12.

Next, as shown in FIGS. 13 and 14, through-holes 107 are formed so as to reach the bit lines 101 from the uppermost peripheral dielectric film 105 by patterning the gate electrodes 104 and the peripheral dielectric films 105 by reactive ion etching utilizing a photoresist film 106 as a mask.

Figure 15:
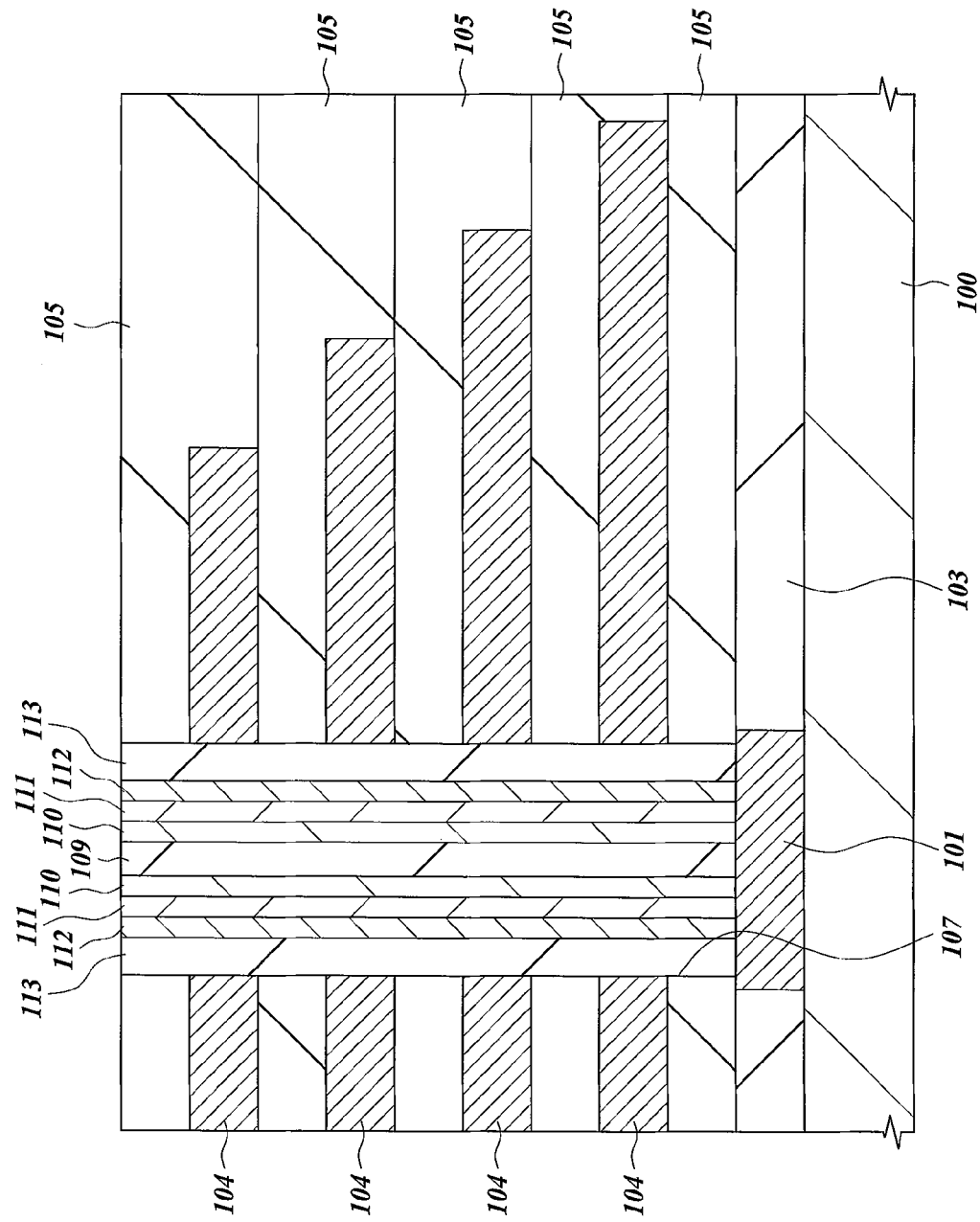
FIG. 15 is a sectional view of its substantial part for explaining the manufacturing method of the phase change memory device in a process continuous from that of FIG. 13.

Next, after the photoresist film 106 is removed, as shown in FIG. 15, a central portion dielectric film 109 made of $SiO_2$, a phase change recording film 110 made of $Ge_2Sb_2Te_5$, an interface layer 111 made of SiSb, a Si channel layer 112, and a gate insulation film 113 made of $Al_2O_3$ are embedded into each of the through-holes 107.

For embedding these films into the through-hole 107, after an $Al_2O_3$ film having a film thickness of 10 nm, a Si film having a film thickness of 4 nm, a SiSb film having a film thickness of 4 nm, a $Ge_2Sb_2Te_5$ film having a film thickness of 4 nm, and a $SiO_2$ film having a film thickness of 8 nm are deposited on the peripheral dielectric film 105 in this order, for example, by the CVD method, these films left on the peripheral dielectric film 105 are polished and removed by the CMP method. Initial states of the SiSb film constituting the interface layer 111 and the $Ge_2Sb_2Te_5$ film constituting the phase change recording film 110 are in crystal phase.

Figure 16:
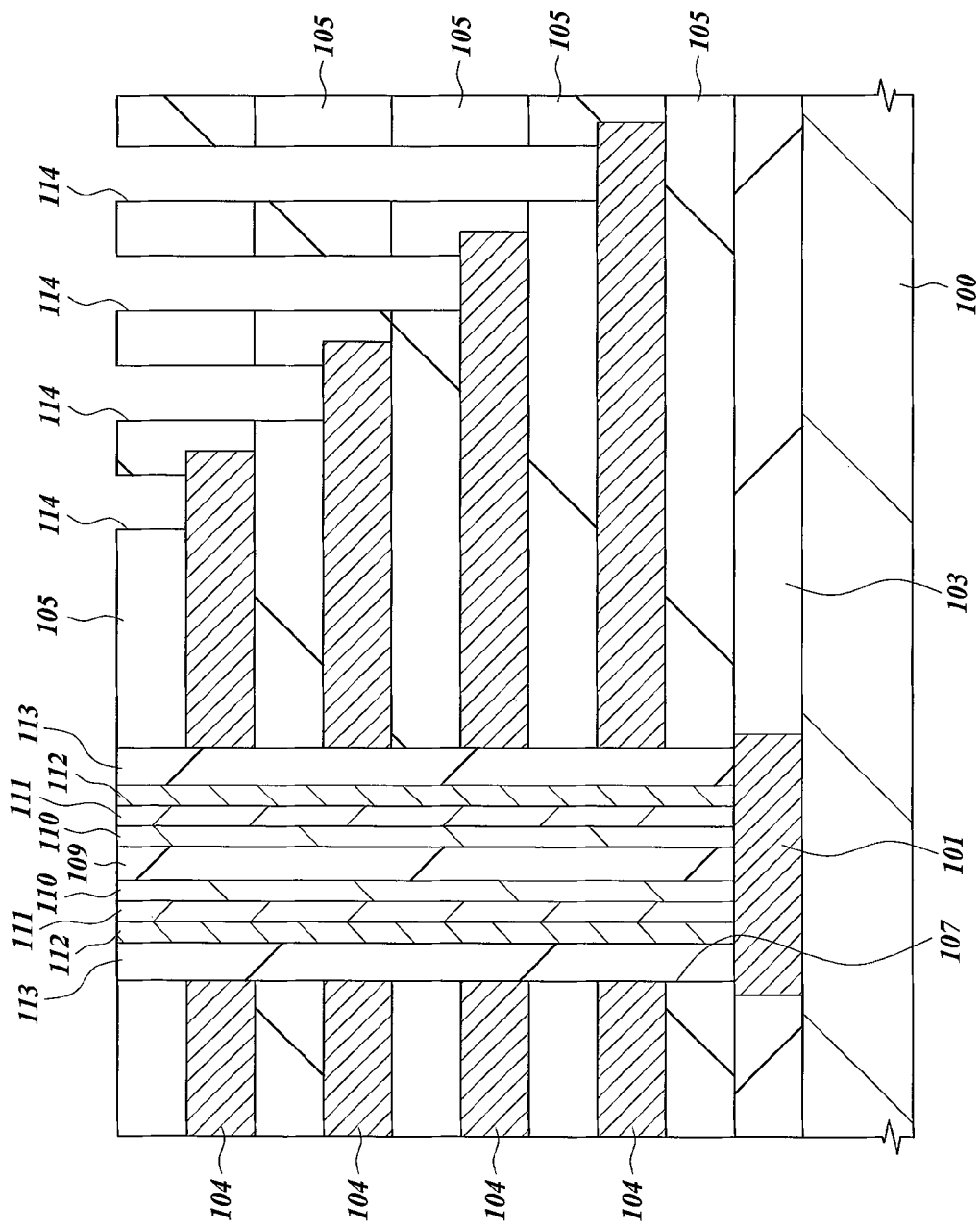
FIG. 16 is a sectional view of its substantial part for explaining the manufacturing method of the phase change memory device in a process continuous from that of FIG. 15.

Next, as shown in FIG. 16, via holes 114 are respectively formed on the four layered gate electrodes 104 by applying dry etching to the peripheral dielectric films 105 using a photoresist film (not shown) as a mask.

Figure 17:
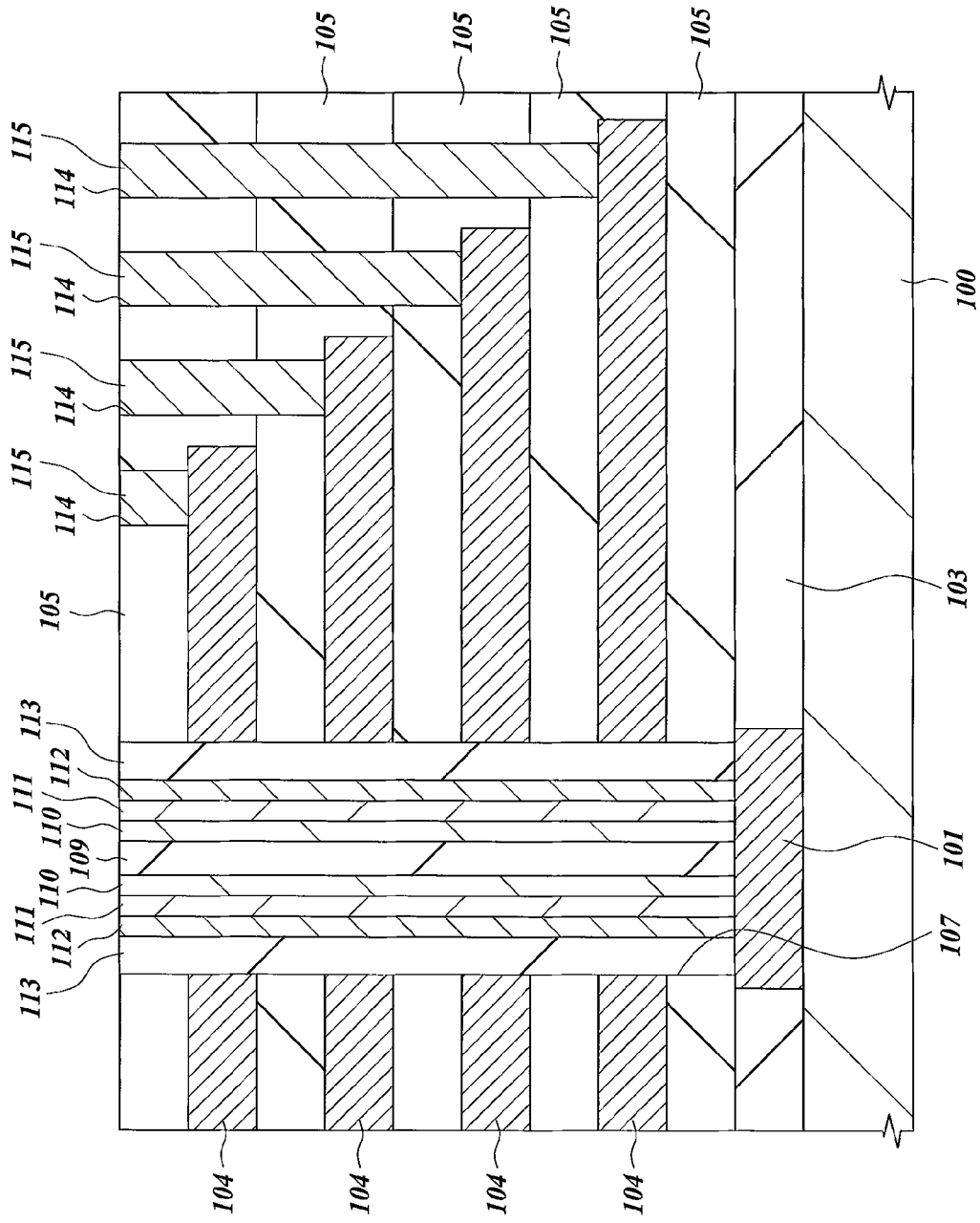
FIG. 17 is a sectional view of its substantial part for explaining the manufacturing method of the phase change memory device in a process continuous from that of FIG. 16.

Next, as shown in FIG. 17, gate wires 115 made of Si (silicon) are embedded into the via holes 114. For embedding the gate wires 115 into the via holes 114, after a Si film is deposited on the peripheral dielectric film 105, for example, by using the CVD method, the Si film left on the peripheral dielectric film 105 is polished and removed by the CMP method.

Figure 18:
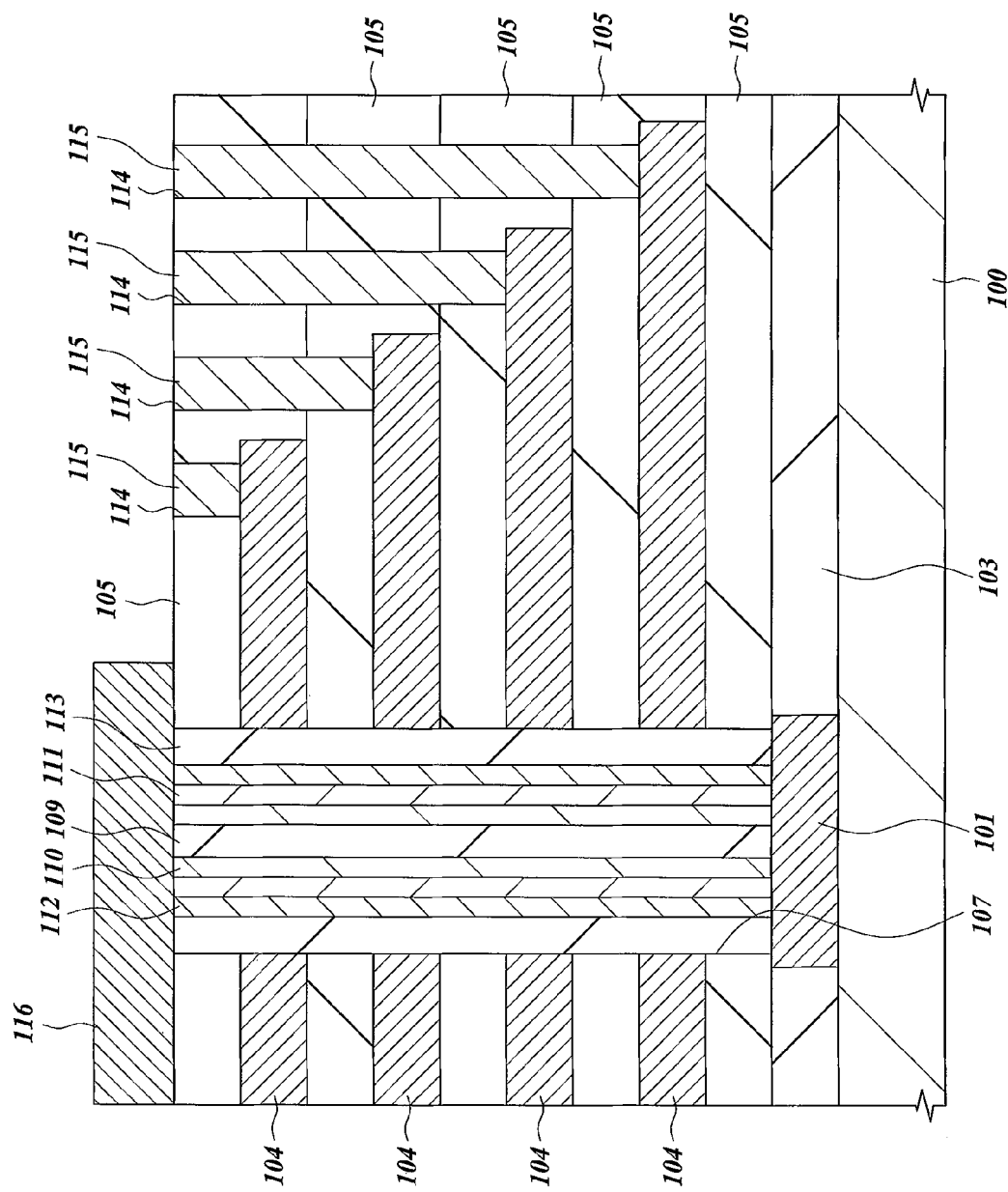
FIG. 18 is a sectional view of its substantial part for explaining the manufacturing method of the phase change memory device in a process continuous from that of FIG. 17.
Figure 19:
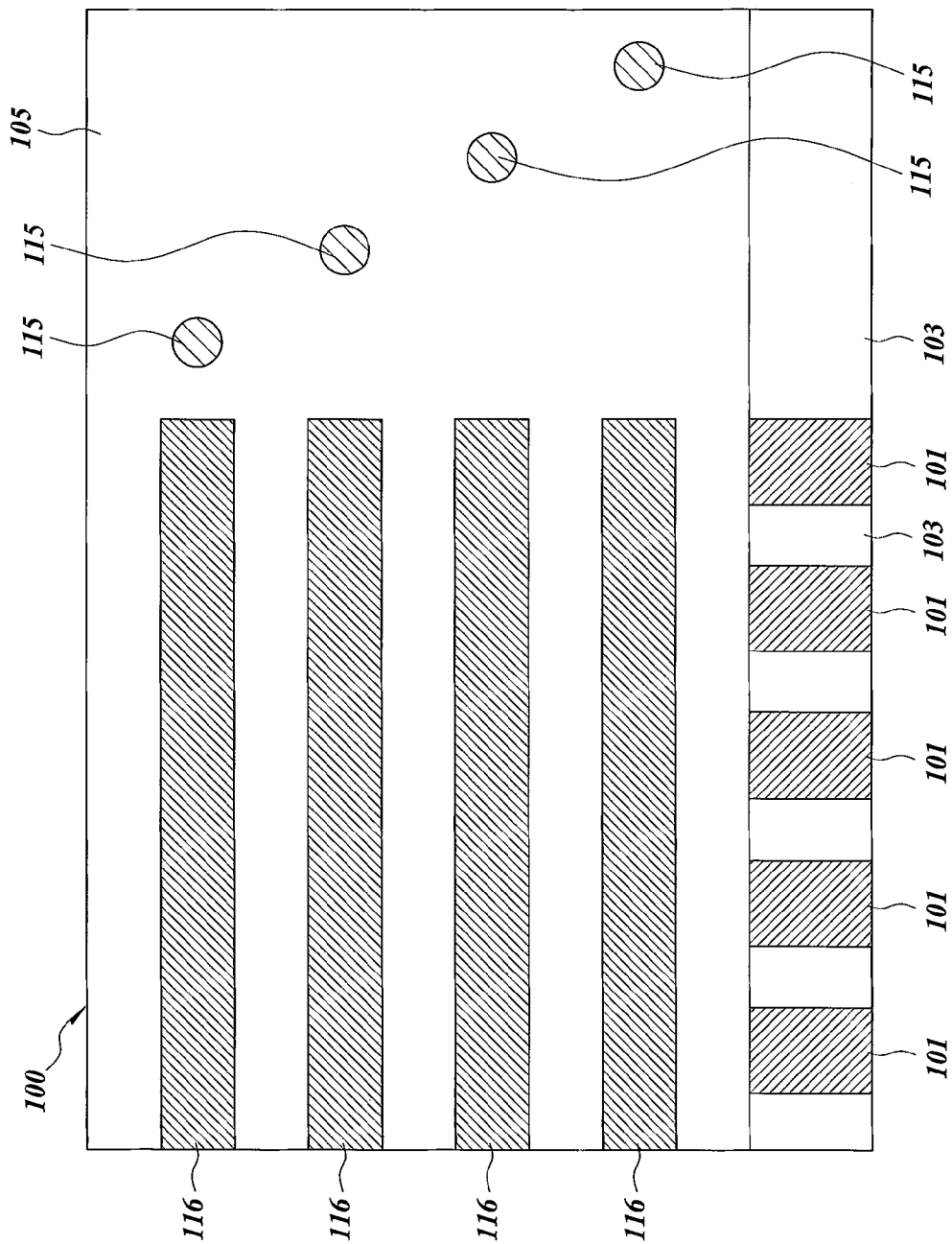
FIG. 19 is a plan view of its substantial part for explaining the manufacturing method of the phase change memory device in a process continuous from that of FIG. 17.

Next, as shown in FIGS. 18 and 19, word lines (upper electrodes) 116 made of W (tungsten) are formed on the peripheral dielectric films 105. For forming the word lines 116, a W film having a film thickness of 50 nm is firstly deposited on, for example, the peripheral dielectric film 105 by the sputtering method, and the W film is then patterned by reactive ion etching using a photoresist film (not shown) as a mask.

The word lines 116 are arranged so as to extend in a direction approximately perpendicular to the bit lines 101, and to extend approximately in the same direction as the gate electrodes 104. And by applying voltage to any of intersection points of the word lines 116 and the bit lines 101, the recording bit shown in FIG. 1 can be selected three-dimensionally.

Figure 20A:
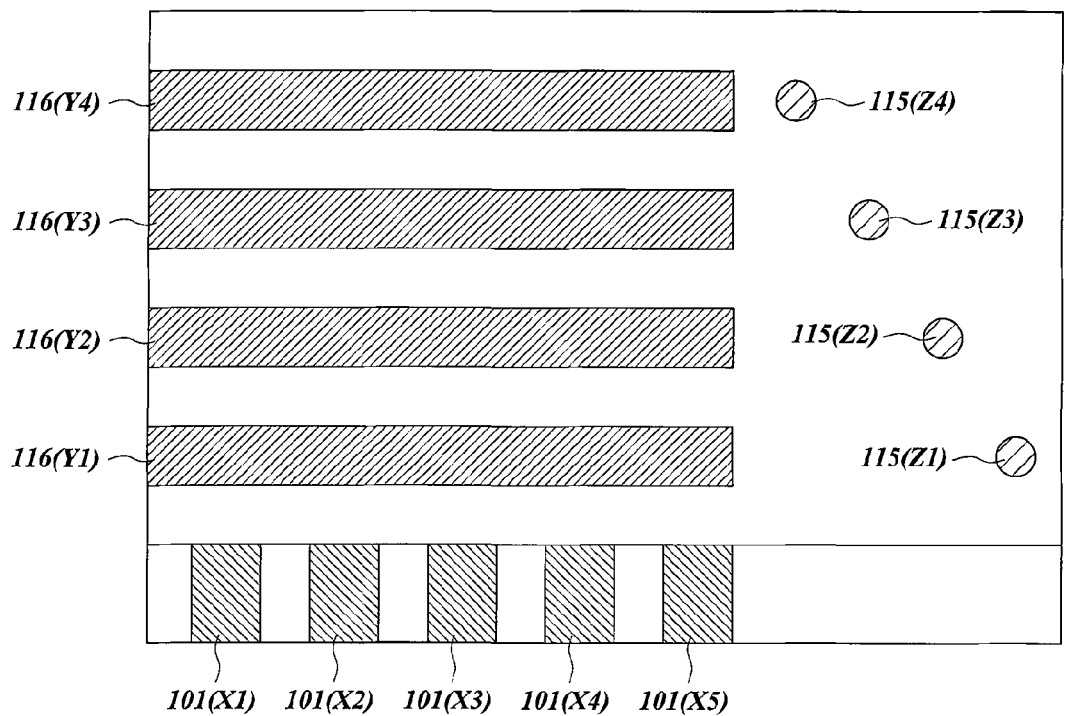
FIGS. 20A and 20B are explanatory views of an electrode arrangement of the phase change memory device manufactured according to the embodiment of the present invention.
Figure 20B:
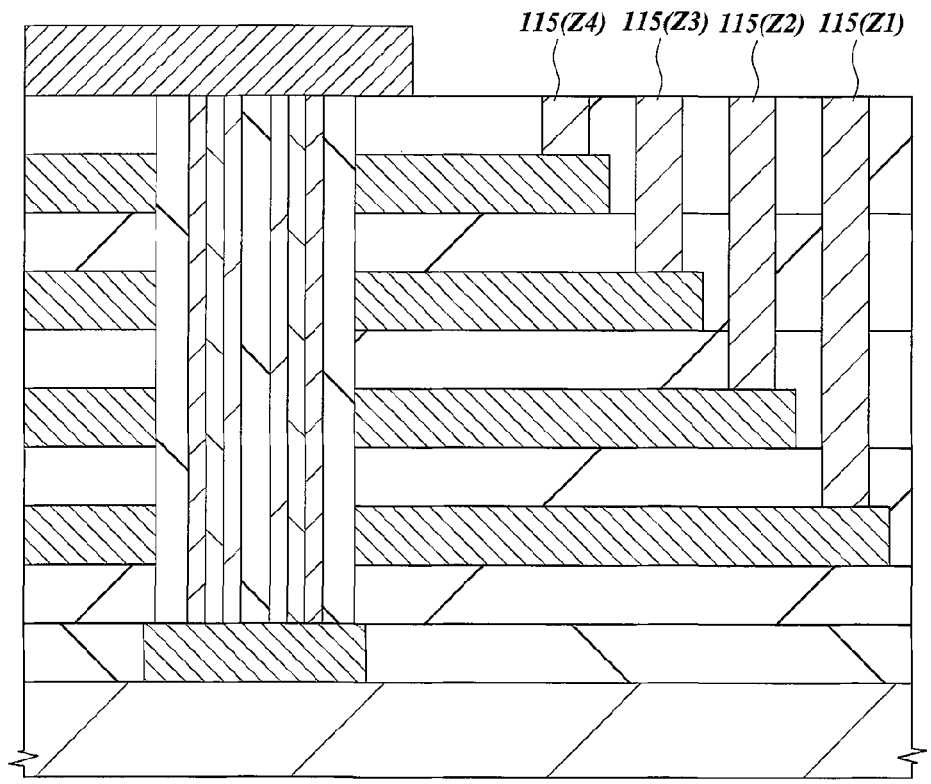

Here, electrode numbers (X1 to X5, Y1 to Y4, and Z1 to Z4) as shown in FIGS. 20A and 20B are respectively attached to the bit lines 101, the word lines 116, and the gate wires 115 shown in FIGS. 18 and 19. The position of the recording bit is shown by coordinates obtained by combination of these electrode numbers.

In the phase change memory device of this embodiment, each state of the bits (X2, Y2, Z3) is firstly examined and recorded. In this embodiment, these bits are called "adjacent bits".

Next, a current value obtained by applying DC voltages of 0.1 volts, 0 volts, and 3 volts to the respective electrodes X2, Y2, and Z3 was about 3.2 μA. That is, the resistance value is about 3.2 kΩ, and we think that the state of the recording film is in a crystal phase.

Next, a mark was recorded on the above recording bit. When voltage pulses of DC voltages of 3 volts, 5 volts, and 0 volts are applied to the respective electrodes Z3, X2, and Y2 with a time width of 30 ns, the resistance value reaches about 5 MΩ. From this, we think that the above-mentioned recording bit is changed to an amorphous state. This voltage pulse condition is hereinafter called "Reset pulse". That is, the amorphous state is here defined as "Reset state".

Furthermore, when voltage pulses of DC voltages of 3 volts, 3 volts, and 0 volts were applied to the electrode Z3, the electrode X2, and the electrode Y2 with a time width of 100 ns, respectively, the resistance value of the bit was changed to about 5 kΩ. From this, it was confirmed that change reversibly occurs between a crystal state and an amorphous state in this bit. The voltage pulse condition is hereinafter called "Set pulse". That is, the crystal state is here defined as "Set state". It was confirmed that the resistance value was changed to about 5 kΩ by applying the Reset pulse to this Set state again.

Next, the state of the bits (X2, Y2, Z2) adjacent to the adjacent bit in the Z direction was examined. In this case, these bits are called "recording bit".

Figure 21:
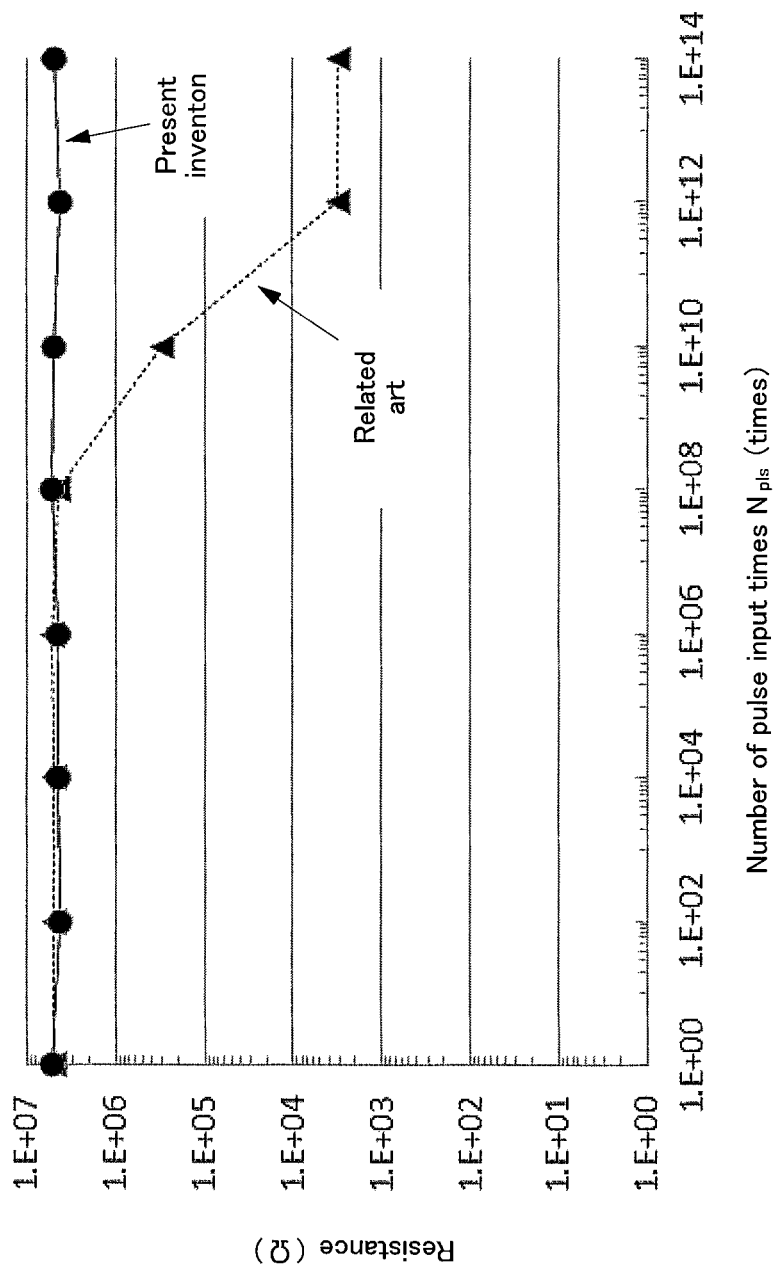
FIG. 21 is a graph showing a measurement result of resistance values of an adjacent bit obtained by continuously applying Reset pulses into a recording bit.
Figure 22:
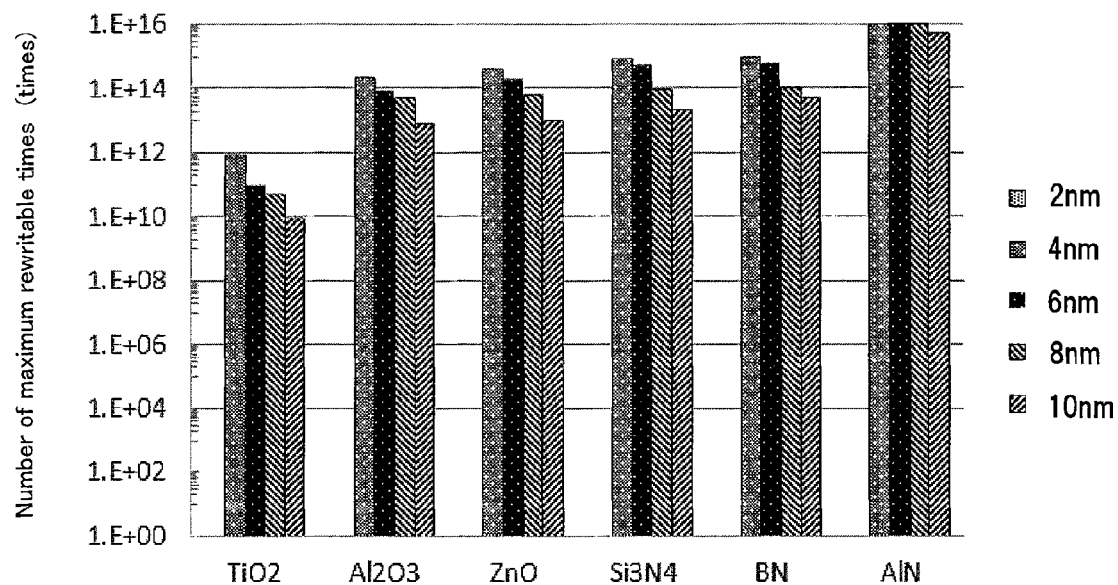
FIG. 22 is a graph showing a measurement result of resistance change of an adjacent bit after repetitive rewritings in a single cell.
Figure 23:
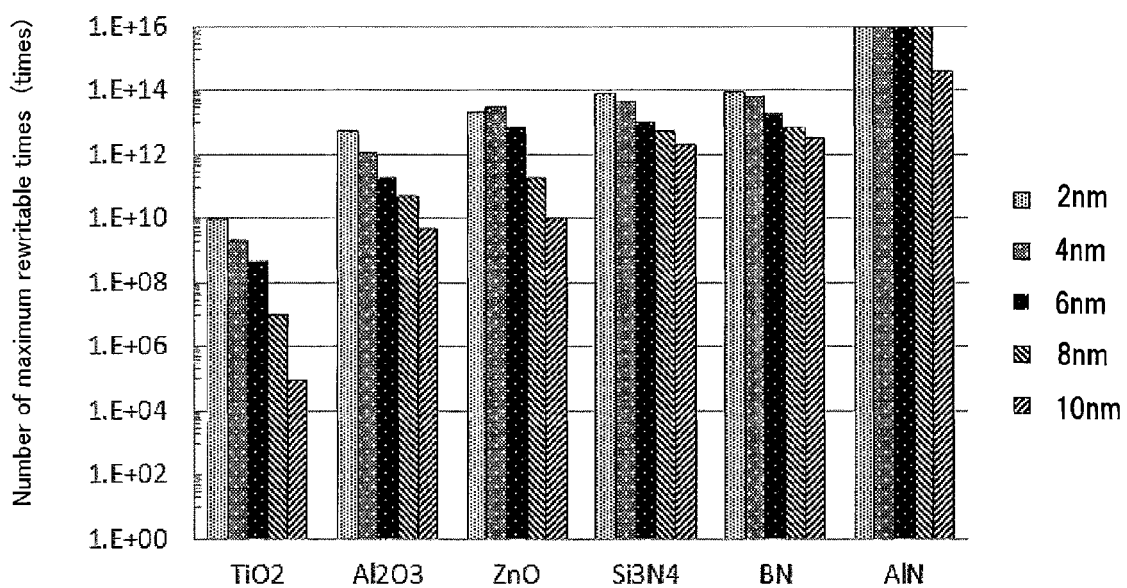
FIG. 23 is a graph showing a measurement result of resistance change of an adjacent bit after repetitive rewritings in a single cell.
Figure 24:
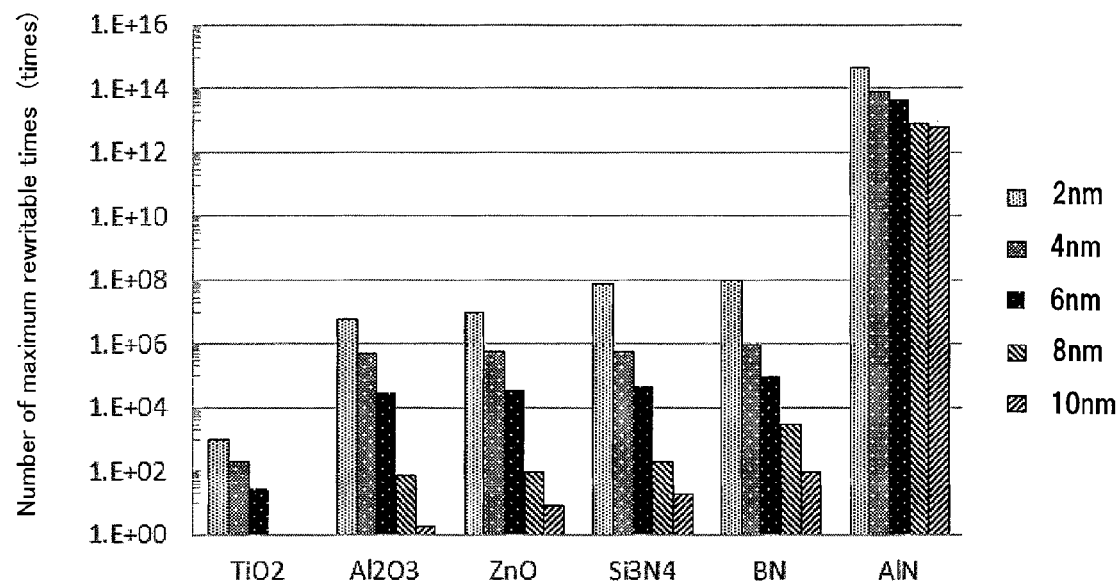
FIG. 24 is a graph showing a measurement result of resistance change of an adjacent bit after repetitive rewritings in a single cell.
Figure 25:
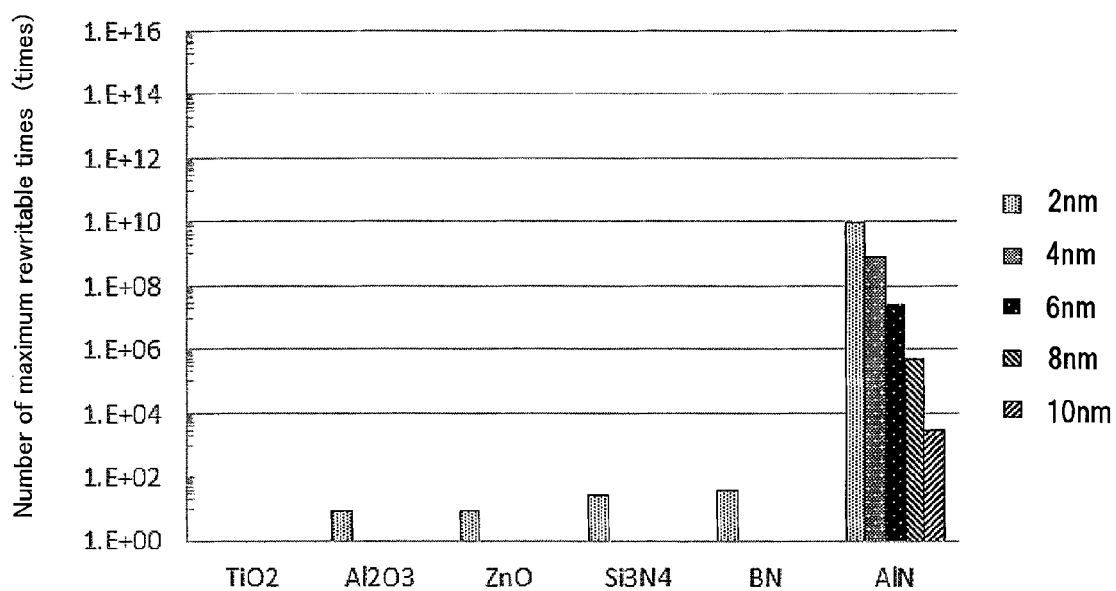
FIG. 25 is a graph showing a measurement result of resistance change of an adjacent bit after repetitive rewritings in a single cell.

When examination was performed according to the same procedure as the above, we found that this bit was a crystal state. Next, when the resistance of the adjacent bit was examined by applying Reset pulse to this bit one time, the resistance value was about 5 MΩ which was the same as the original value. Thereafter, the result obtained by further applying Reset pulses to the recording bit continuously to measure the resistance value of the adjacent bit is shown in FIG. 21. For comparison, a device using a $SiO_2$ film as the gate insulation film, which was a related art, was manufactured, and comparison measurement was performed.

From this result, decrease of the resistance value which is thought to be due to partial crystallization caused by pulse application of $10^{10}$ times appeared in the device of the related art, while the change of the resistance value did not appear even by pulse application of $10^{14}$ times in the device of the present invention, from which, it is found that the thermal disturbance is suppressed.

When the Reset pulse was applied to the adjacent bits of the device of the related art and the device of the present invention, the resistance values of the adjacent bits was changed to about 5 MΩ, and when the Set pulse was applied to it, the resistance values were changed to about 3 kΩ. From this, it was confirmed that a failure did not occur in the adjacent bits (X2, Y2, Z3).

Furthermore, when the set pulse was applied to the recording bit (X2, Y2, Z2), the resistance value was changed to 3.5 kΩ, and from this, it was confirmed that a failure did not occur in the recording bit. However, when Reset pulses were applied to the recording bit $10^{16}$ times, the resistance value of the recording bit was changed to 100 MΩ or more, and even when the Reset pulse voltage was then elevated, the resistance value was not changed at all. From this, it was considered that the recording bit was broken for any reason.

The same experiments as the above were performed regarding respective devices where the gate insulation films were made of $TiO_2$, $Al_2O_3$, BN, $Si_3N_4$, and AlN, respectively, and as a result of these experiments, significant changes of the resistance values of the adjacent bits did not appear to the number of pulse application times of $10^{14}$ or less as well as the result shown in FIG. 21.

(Second Embodiment)

In the second embodiment, as another example, the gate insulation film 16 of the device shown in FIG. 1 is composed of two insulation layers, one of the insulation layers is arranged adjacent to the Si channel layer 15 and composed of a $SiO_2$ film, the other of the insulation layers is closer to the gate electrode 17 than that, and this configuration will be described hereinafter.

In this example, the film thicknesses of the above-mentioned $SiO_2$ films are set to 1 nm, 2 nm, 3 nm, and 4 nm. Furthermore, other insulation films adjacent to the $SiO_2$ film are made of $TiO_2$, $Al_2O_3$, BN, $Si_3N_4$, and AlN, and their film thicknesses are set to 2 nm, 4 nm, 6 nm, 8 nm, and 10 nm. The interface layer and the phase change recording film are respectively composed of SiSb film and $Ge_2Sb_2Te_5$ film as well as those of the first embodiment. Furthermore, a diameter of each through hole 107 (see FIGS. 13 and 14) in which these thin films are embedded is set to 32 nm.

The same experiment as that in the first embodiment was performed using the above samples, and the resistance changes of the adjacent cells were measured after repetitive rewritings in a single cell.

The number of times of rewriting (the maximum number of times of rewriting) where the resistance in the adjacent cell decreased significantly is shown in FIGS. 22 to 25. FIGS. 22 to 25 are measurement results of samples where the film thicknesses of the $SiO_2$ films are 1 nm, 2 nm, 3 nm, and 4 nm, respectively. The values of 2 nm to 10 nm of kinds of bar graphs show film thicknesses of the insulation films other than the $SiO_2$ film. That is, for example, the graph showing the case where $TIO_2$ is 4 nm in FIG. 23 means that the film thickness of the $SiO_2$ film is 2 nm, the film thickness of the $TiO_2$ film is 4 nm, and the total film thickness of the gate insulation film is 6 nm.

Incidentally, in this experiment, rewriting experiment of $10^{16}$ times or more was not performed. This is because it was determined that the fact that rewriting of $10^{16}$ times was possible sufficiently satisfied specifications as a storage device and as a memory.

Furthermore, in FIGS. 22 to 25, each portion where a graph is not described indicates a case where the resistance value of the cell was changed when rewriting was performed at the adjacent cell one time, or a case where a bit could not be recorded in the cell or the adjacent cell. For example, in FIG. 22 where the film thickness of the $SiO_2$ film is 1 nm, when the film thickness of the insulation film other than the $SiO_2$ film is 2 nm, graphs cannot be charted because a bit could not be recorded. It is thought that the cause lies in that leak current from the gate electrode occurred due to such a fact that the film thickness of the gate insulation film was excessively thin.

From this experiment result, if it is assumed that the thermal conductivities of the insulation materials other than $SiO_2$ are values described in Table 1, it is found that the expression (6) to (8) are satisfied. In FIGS. 22 to 25, the columns where no value is described indicate that the resistance value of the cell could not be changed. Since all of the samples where the resistance value of the cell could not be changed are samples where the gate insulation films are thin in film thickness, it is estimated that the cause lies in that the electrical insulation property of the gate insulation film is low and leak current is generated by a voltage applied to the gate electrode.

Though the invention which has been made by the present inventers has been specifically described above based upon the embodiments, the present invention is not limited to the embodiments, and it goes without saying that the present invention can be modified variously without departing from the gist of the present invention.

The present invention is available for a phase change memory device having a three-dimensional structure.

What is claimed is:

1. A phase change memory device which records data therein by utilizing a difference in electric resistance occurring when a state of a recording film is reversibly changed between an amorphous state and a crystal state, comprising:
    a plurality of recording cells disposed between a plurality of word lines extending in a first direction parallel to a main surface of a semiconductor substrate and a plurality of bit lines intersecting the plurality of work lines and extending in a second direction parallel to the main surface of the semiconductor substrate,
    wherein the plurality of recording cells are composed of a phase change recording film, a Si channel layer and a gate insulation film which are continuously formed along a third direction perpendicular to the main surface of the semiconductor substrate, respectively, and a plurality of gate electrodes formed along the third direction, wherein $\kappa_{diel} \geq -9.36 \times 10^{-3} d_{diel}^2 + 5.72 \times 10^{-1} d_{diel} - 1.03 \times 10^{-1}$ (9)

a relationship between a film thickness $d_{diel}$ and a thermal conductivity $\kappa_{deil}$ of the gate insulation film satisfies the above expression (9).

2. The phase change memory device according to claim 1, wherein the gate insulation film includes at least one insulation film selected from a group consisting of a BN film, an $Al_2O_3$ film, an AlN film, a $TiO_2$ film, a $Si_3N_4$ film, and a Zn film.

3. A phase change memory device which records data therein by utilizing a difference in electric resistance occurring when a state of a recording film is reversibly changed between an amorphous state and a crystal state, comprising:
    a plurality of recording cells disposed between a plurality of word lines extending in a first direction parallel to a main surface of a semiconductor substrate and a plurality of bit lines intersecting the plurality of work lines and extending in a second direction parallel to the main surface of the semiconductor substrate,
    wherein the plurality of recording cells are composed of a phase change recording film, a Si channel layer and a gate insulation film which are continuously formed along a third direction perpendicular to the main surface of the semiconductor substrate, respectively, and a plurality of gate electrodes formed along the third direction, wherein $\kappa_{diel} \geq -9.36 \times 10^{-} d_{diel}^2 + 5.72 \times 10^{-1} d_{diel} - 1.03 \times 10^{31}$ 1 (9)

a relationship between a film thickness $d_{diel}$ and a thermal conductivity $\kappa_{diel}$ of the gate insulation film satisfies the above expression (9), the film thickness $d_{diel} \geq 5$ nm and the thermal conductivity $\kappa_{diel} \geq 2.5$ W/mK.

* * * * *

UNITED STATES PATENT AND TRADEMARK OFFICE
CERTIFICATE OF CORRECTION

PATENT NO. : 9,082,955 B2
APPLICATION NO. : 13/589457
DATED : July 14, 2015
INVENTOR(S) : Toshimichi Shintani et al.

It is certified that error appears in the above-identified patent and that said Letters Patent is hereby corrected as shown below:

In the Claims:

Claim 1, Column 14, line 34, after "wherein" should read:
"$\kappa_{diel} \geq -9.36 \times 10^{-3} d_{diel}^2 + 5.72 \times 10^{-1} d_{diel} - 1.03 \times 10^{-1}$ • • • (9)".

Claim 1, Column 14, line 36, after "conductivity" should read: "$\kappa_{diel}$".

Claim 3, Column 14, line 60, after "wherein" should read:
"$\kappa_{diel} \geq -9.36 \times 10^{-3} d_{diel}^2 + 5.72 \times 10^{-1} d_{diel} - 1.03 \times 10^{-1}$ • • • (9)".

Signed and Sealed this
Fifth Day of July, 2016

Michelle K. Lee
*Director of the United States Patent and Trademark Office*